United States Patent
Tanigawa et al.

(10) Patent No.: US 10,170,689 B2
(45) Date of Patent: Jan. 1, 2019

(54) SEMICONDUCTOR DEVICE

(71) Applicant: Renesas Electronics Corporation, Kawasaki-shi, Kanagawa (JP)

(72) Inventors: Hironobu Tanigawa, Kanagawa (JP); Tetsuhiro Suzuki, Kanagawa (JP); Katsumi Suemitsu, Kanagawa (JP); Takuya Kitamura, Kanagawa (JP); Eiji Kariyada, Kanagawa (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 280 days.

(21) Appl. No.: 14/591,562

(22) Filed: Jan. 7, 2015

(65) Prior Publication Data

US 2015/0207063 A1    Jul. 23, 2015

(30) Foreign Application Priority Data

Jan. 22, 2014   (JP) .................................. 2014-009209

(51) Int. Cl.
  *H01L 29/82*   (2006.01)
  *H01L 43/08*   (2006.01)
  *G11C 11/16*   (2006.01)

(52) U.S. Cl.
  CPC .......... *H01L 43/08* (2013.01); *G11C 11/1675* (2013.01)

(58) Field of Classification Search
  CPC ....... G11C 11/16; G11C 11/161; H01L 43/08; H01L 43/02; H01L 27/222
  USPC ......................................................... 257/421
  See application file for complete search history.

(56) References Cited

U.S. PATENT DOCUMENTS

| | | | |
|---|---|---|---|
| 8,416,611 B2 | 4/2013 | Fukami et al. | |
| 8,787,076 B2 | 7/2014 | Fukami et al. | |
| 2006/0050446 A1* | 3/2006 | Ishizone | B82Y 10/00 360/324.12 |
| 2011/0163402 A1* | 7/2011 | Fukami | G11C 19/0808 257/421 |

FOREIGN PATENT DOCUMENTS

| | | |
|---|---|---|
| JP | 2008-192711 A | 8/2008 |
| WO | 2009/001706 A1 | 12/2008 |
| WO | 2010/026861 A1 | 3/2010 |

OTHER PUBLICATIONS

A. Yamaguchi et al., "Real-Space Observation of Current-Driven Domain Wall Motion in Submicron Magnetic Wires", Physical Review Letters, Feb. 20, 2004, pp. 077205-1-077205-4, vol. 92, No. 7.

(Continued)

*Primary Examiner* — Duy T Nguyen
(74) *Attorney, Agent, or Firm* — Sughrue Mion, PLLC

(57) ABSTRACT

The present invention provides a magnetoresistive effect element which performs writing by a novel method. In a state in which a current does not flow in a magnetization free layer MFR, the magnetization free layer MFR has a magnetic wall MW1 on the side of a magnetization fixed layer MFX1. A magnetic wall MW2 is moved to the magnetic wall MW1 side by causing current to flow from the formed side of the magnetic wall MW1. Thus, an electrical resistance $R_{MTJ}$ between a reference layer REF and the magnetization free layer MFR changes from a low state to a high state.

7 Claims, 30 Drawing Sheets

A-A' (MR)

(56) References Cited

OTHER PUBLICATIONS

Hironobu Tanigawa et al., "Domain Wall Motion Induced by Electric Current in a Perpendicularly Magnetized Co/Ni Nano-Wire", Applied Physics Express 2, 2009, pp. 053002-1-053002-3.

* cited by examiner

A-A' (MR)

A-A' (MR)

A-A' (MR)

A-A' (MR)

A-A' (MR)

A-A' (MR)

A-A' (MR)

SEMICONDUCTOR DEVICE

CROSS-REFERENCE TO RELATED APPLICATIONS

The disclosure of Japanese Patent Application No. 2014-009209 filed on Jan. 22, 2014 including the specification, drawings and abstract is incorporated herein by reference in its entirety.

BACKGROUND

The present invention relates to a semiconductor device, and, for example, to a technology applicable to a semiconductor device having a memory.

As a memory for achieving a high-speed operation, a magnetic random access memory (MRAM) is attracting attention now. As the MRAM, a device that generates a magnetic wall inside a ferromagnetic body and moves the magnetic wall to operate is now under examination.

It has been now observed that as described in, for example, Non-Patent Document 1 and Non-Patent Document 2, a magnetic wall in a ferromagnetic body is moved by a current and further moved in a direction opposite to the direction of the current. Further, a magnetoresistive effect element that moves a magnetic wall using such a spin torque to perform writing has been described in Patent Document 1. Also, a method described in Patent Document 2 has been examined as a method of introducing such a magnetic wall in the ferromagnetic body. A magnetic memory described in Patent Document 2 has a write wiring for applying an external magnetic field to the ferromagnetic body. In this magnetic memory, writing has been performed by the external magnetic field from the write wiring. Further, there has been described in Patent Document 3 that a base layer is provided below a data storage layer being a ferromagnetic body to realize satisfactory vertical magnetic anisotropy of the data storage layer.

RELATED ART DOCUMENTS

Patent Documents

[Patent Document 1] International Patent Publication No. 2009/001706
[Patent Document 2] Japanese Unexamined Patent Application Publication No. 2008-192711
[Patent Document 3] International Patent Publication No. 2010/026861

Non-Patent Documents

[Non-Patent Document 1] A Yamaguchi et al., Real-Space Observation of Current-Driven Domain Wall Motion in Submicron Magnetic Wires, Physical Review Letters, Vol. 92, 077205, 2004.
[Non-Patent Document 2] H. Tanigawa et al., Domain Wall Motion Induced by Electric Current in a Perpendicularly Magnetized Co/Ni Nano-Wire, Applied Physics Express, 2, 053002, 2009.

SUMMARY

As a magnetoresistive effect element that performs writing by driving a magnetic wall, as described in Patent Document 2, for example, a device is being developed now that drives the magnetic wall introduced by the external magnetic field. On the other hand, the present inventors have examined a magnetoresistive effect element that performs writing by a novel method. Other problems and novel features will be apparent from the description of the present specification and the accompanying drawings.

According to one aspect of the present invention, there is provided a semiconductor device which includes a magnetization free layer, a reference layer, a first magnetization fixed layer, and a second magnetization fixed layer. The magnetization free layer has a first surface and a second surface that face each other. The reference layer is electrically coupled to the first surface of the magnetization free layer. The first magnetization fixed layer and the second magnetization fixed layer are electrically coupled to the second surface of the magnetization free layer. Further, the first magnetization fixed layer and the second magnetization fixed layer are separated from each other along the second surface. Furthermore, a conductive first non-magnetic layer is provided between the magnetization free layer and the first magnetization fixed layer. Likewise, a conductive second non-magnetic layer is provided between the magnetization free layer and the second magnetization fixed layer. The first non-magnetic layer and the second non-magnetic layer are separated from each other.

According to another aspect of the present invention, there is provided a semiconductor device which includes a magnetization free layer, a reference layer, a first magnetization fixed layer, and a wiring. The reference layer is electrically coupled to a first surface of the magnetization free layer. The first magnetization fixed layer is provided in the vicinity of the magnetization free layer. The wiring is electrically coupled to the magnetization free layer. Further, the first magnetization fixed layer is not electrically coupled to the magnetization free layer.

According to a further aspect of the present invention, there is provided a semiconductor device which includes a magnetization free layer, a reference layer, a first magnetization fixed layer, and a second magnetization fixed layer. The magnetization free layer has a first surface and a second surface that face each other. The reference layer is electrically coupled to the first surface of the magnetization free layer. The first magnetization fixed layer and the second magnetization fixed layer are electrically coupled to the second surface of the magnetization free layer. Further, the first magnetization fixed layer and the second magnetization fixed layer are separated from each other along the second surface. When a current does not flow in the magnetization free layer, the magnetization free layer has a magnetic wall on one of the side of the first magnetization fixed layer and the side of the second magnetization fixed layer. Then, the current is made to flow in the magnetization free layer from the formed side of the magnetic wall to thereby change a state of an electrical resistance between the reference layer and the magnetization free layer.

According to the above one aspect, there is provided a magnetoresistive effect element that performs writing by a novel method.

and

Figure 33:
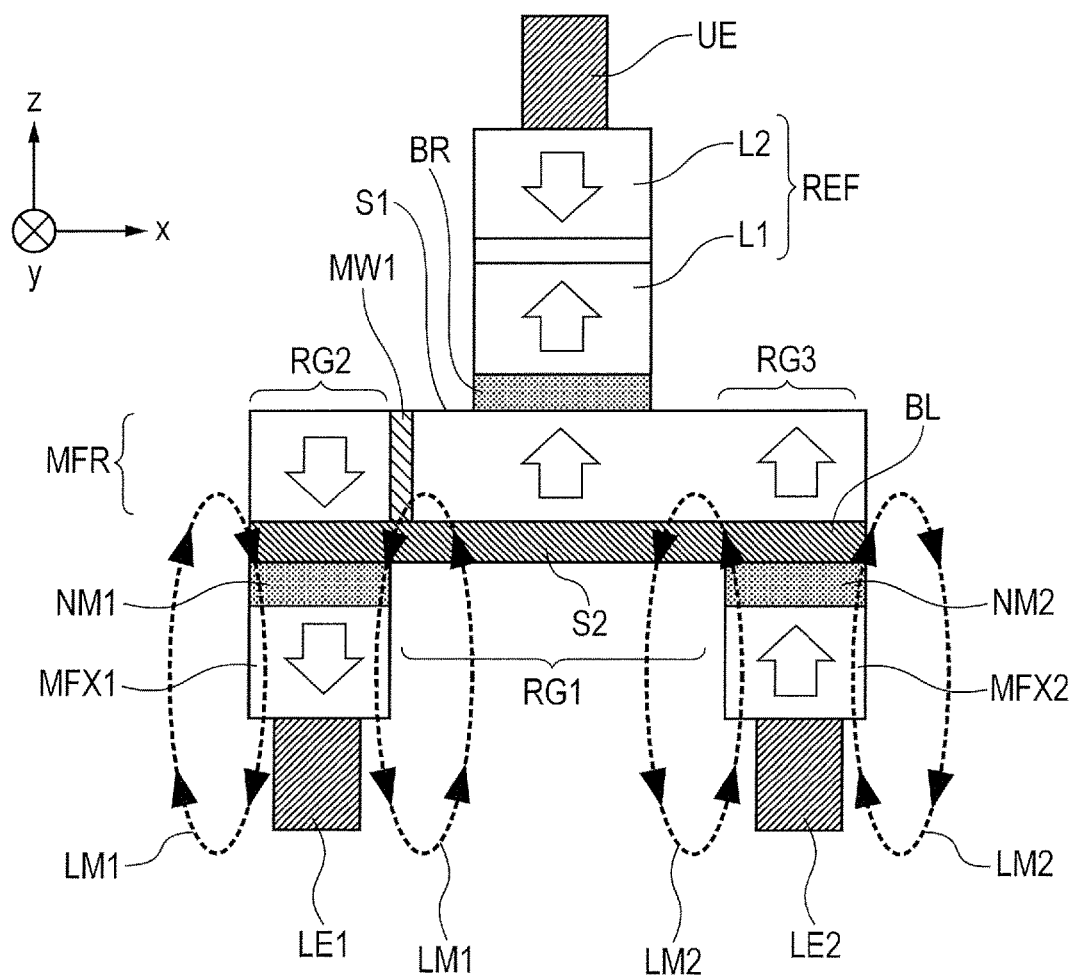

FIG. 33 is a cross-sectional diagram of a magnetoresistive effect element according to a modification 13.

DETAILED DESCRIPTION

Preferred embodiments will hereinafter be described using the accompanying drawings. Incidentally, in all of the drawings, like reference numerals are respectively attached to like components, and their description will be omitted as appropriate.

(Embodiment)

Figure 1:
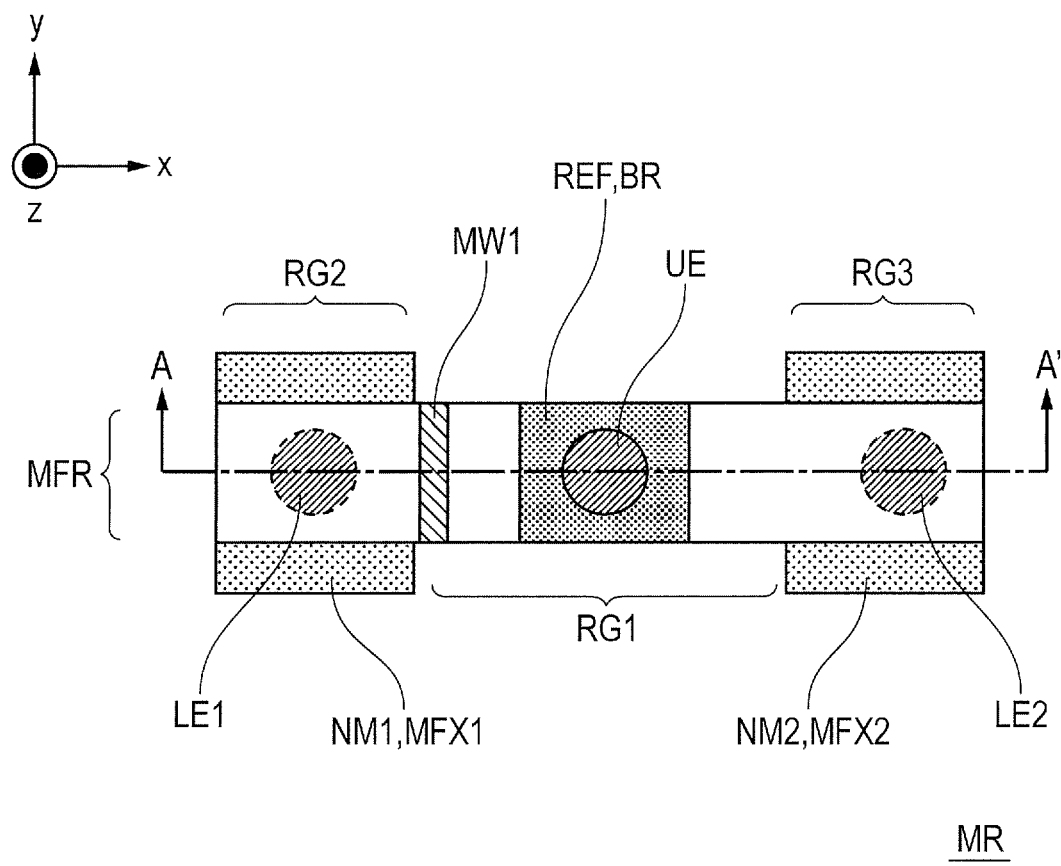
FIG. 1 is a plan diagram of a magnetoresistive effect element according to an embodiment.
Figure 2:
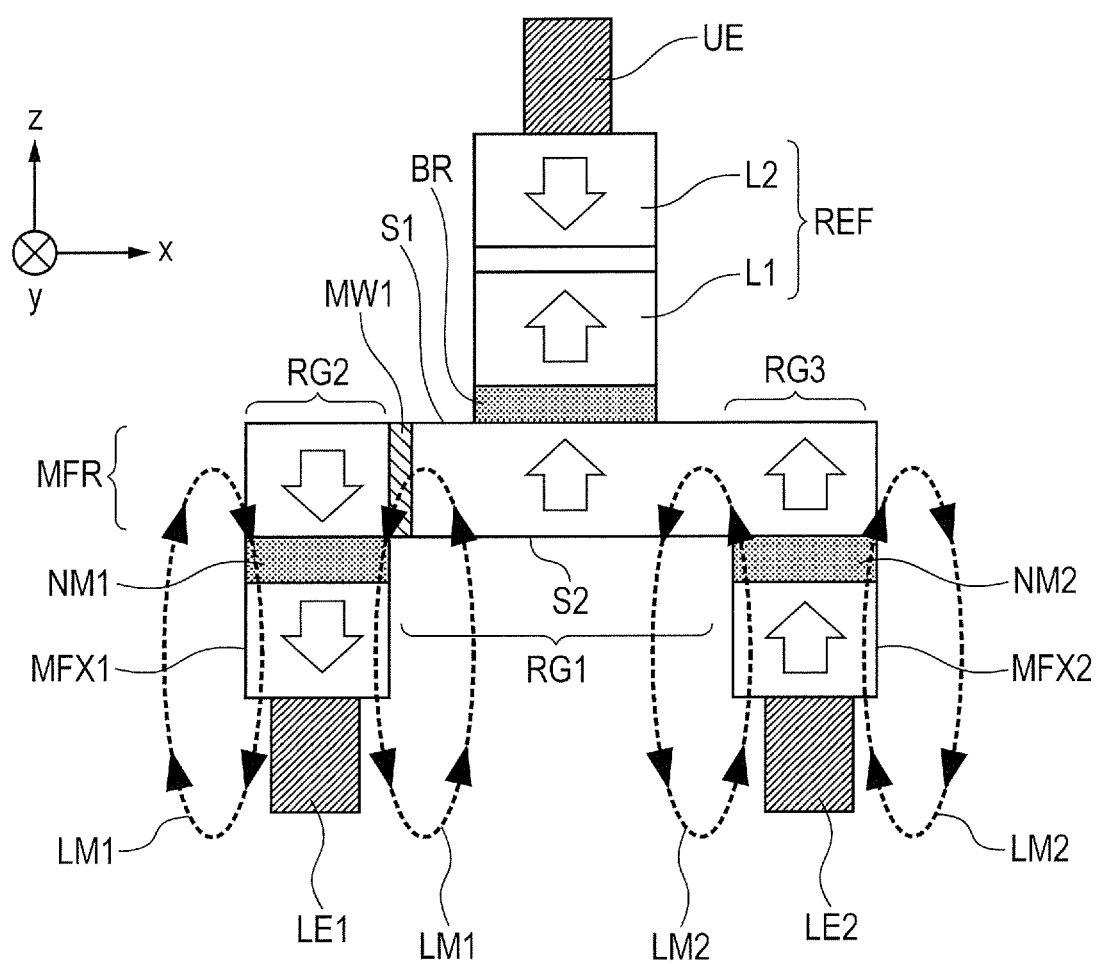
FIG. 2 is a cross-sectional diagram taken along line A - A' of FIG. 1.

FIG. 1 is a plan diagram of a magnetoresistive effect element according to an embodiment. FIG. 2 is a cross-sectional diagram taken along line A-A' of FIG. 1. A semiconductor device of the present embodiment includes the magnetoresistive effect element MR. The magnetoresistive effect element MR is provided with a magnetization free layer MFR, a reference layer REF, a magnetization fixed layer MFX1 and a magnetization fixed layer MFX2.

The magnetization free layer MFR has a surface S1 and a surface S2 that face each other. In the example illustrated in the present figure, the surface S1 and the surface S2 are opposed in a z-axis direction. Also, the magnetization free layer MFR has a longitudinal direction in an x-axis direction and a lateral direction in a y-axis direction as viewed from the z-axis direction. Further, the thickness in the z-axis direction of the magnetization free layer MFR is smaller than the length in the x-axis direction of the magnetization free layer MFR.

The magnetization free layer MFR is a ferromagnetic body having vertical magnetic anisotropy and is capable of having magnetization parallel or anti-parallel to its thickness direction. Further, the magnetization free layer MFR has a region RG1, a region RG2 and a region RG3. The region RG1 overlaps with the reference layer REF to be described later as seen from the z-axis direction. The region RG2 is positioned on the side of one end in the longitudinal direction of the magnetization free layer MFR, and the region RG3 is positioned on the side of the other end in the longitudinal direction of the magnetization free layer MFR. Then, the region RG1 is sandwiched between the region RG2 and the region RG3 in the longitudinal direction (x-axis direction) of the magnetization free layer MFR. Incidentally, in the example illustrated in the present figure, the region RG2 overlaps with a magnetization fixed layer MFX1 to be described later as seen from the z-axis direction, and the region RG3 overlaps with a magnetization fixed layer MFX2 to be described later as seen from the z-axis direction. Also in the example illustrated in the present figure, the region RG1 has magnetization in a +z-axis direction. On the other hand, magnetization is fixed in a –z-axis direction in the region RG2, and magnetization is fixed in the +z-axis direction in the region RG3. Further, a magnetic wall MW1 is formed between the region RG1 and the region RG2. The magnetic wall MW1 is a magnetic wall introduced by an external magnetic field. That is, the magnetic wall MW1 is an initialized magnetic wall. Incidentally, the magnetization of the region RG1 can be reversed as will be described later by operating the magnetoresistive effect element MR.

The reference layer REF includes a layer L1 and a layer L2. The layer L1 is opposed to the surface S1 of the reference layer REF, and the layer L2 is opposed to surface S1 through the layer L1. Further, the layer L1 and the layer L2 have magnetizations anti-parallel to each other. In the example illustrated in the present figure, the magnetization of the layer L1 is fixed in the +z-axis direction, and the magnetization of the layer L2 is fixed in the −z-axis direction.

The reference layer REF is electrically coupled to the surface S1 of the magnetization free layer MFR through a barrier layer BR. In the example illustrated in the present figure, the reference layer REF overlaps with the region RG1 of the reference layer REF as seen from the z-axis direction. Incidentally, the barrier layer BR is, for example, an insulator, specifically, Mg—O, Al—O, Al—N, Ni—O or Hf—O.

The reference layer REF forms a magnetic tunnel junction with the region RG1 of the magnetization free layer MFR. An electrical resistance $R_{MTJ}$ between the region RG1 of the magnetization free layer MFR and the layer L1 of the reference layer REF changes by the magnetic tunnel junction according to the relationship between the direction of magnetization of the region RG1 and the direction of magnetization of the layer L1. That is, information of 0 or 1 is stored in the magnetoresistive effect element, based on the direction of the magnetization of the region RG1. Specifically, when the direction of the magnetization of the region RG1 and the direction of the magnetization of the layer L1 become parallel to each other, the electrical resistance $R_{MTJ}$ between the region RG1 and the layer L1 becomes small. On the other hand, when the direction of the magnetization of the region RG1 and the direction of the magnetization of the layer L1 become anti-parallel, the electrical resistance $R_{MTJ}$ between the region RG1 and the layer L1 becomes large. Therefore, the direction of the magnetization of the region RG1 can be determined by allowing current to flow between the region RG1 and the layer L1. Determining the direction of the magnetization of the region RG1 in this way makes it possible to read data stored in the magnetoresistive effect element MR.

The magnetization fixed layer MFX1 and the magnetization fixed layer MFX2 are electrically coupled to the surface S2 of the magnetization free layer MFR. Further, the magnetization fixed layer MFX1 and the magnetization fixed layer MFX2 are separated from each other in the x-axis direction. That is, the magnetization fixed layer MFX1 and the magnetization fixed layer MFX2 are not directly coupled. In the example illustrated in the present figure, the magnetization fixed layer MFX1 overlaps with the region RG2 of the magnetization free layer MFR as viewed from the z-axis direction. On the other hand, the magnetization fixed layer MFX2 overlaps with the region RG3 as viewed from the z-axis direction.

The magnetization fixed layer MFX1 and the magnetization fixed layer MFX2 are respectively a ferromagnetic body having vertical magnetic anisotropy and capable of having magnetization parallel or anti-parallel to their thickness directions. In the example illustrated in the present figure, the magnetization of the magnetization fixed layer MFX1 is fixed to the same direction (−z-axis direction) as the magnetization of the region RG2 of the reference layer REF. On the other hand, the magnetization of the magnetization fixed layer MFX2 is fixed to the same direction (+z-axis direction) as the magnetization of the region RG3 of the reference layer REF. Further, the magnetization fixed layer MFX1 generates a leakage magnetic field LM1 as illustrated in the present figure. Likewise, the magnetization fixed layer MFX2 also generates a leakage magnetic field LM2.

A non-magnetic layer NM1 is provided between the magnetization free layer MFR and the magnetization fixed layer MFX1. Likewise, a non-magnetic layer NM2 is provided between the magnetization free layer MFR and the magnetization fixed layer MFX2. The non-magnetic layer NM1 and the non-magnetic layer NM2 are respectively a conductive non-magnetic body and are comprised of, for example, a material containing tantalum (Ta), tantalum nitride (TaN) or tungsten (W). Further, the non-magnetic layer NM1 and the non-magnetic layer NM2 are separated from each other and not directly coupled to each other. Incidentally, the thickness of the non-magnetic layer NM1 and the thickness of the non-magnetic layer NM2 are determined according to how the leakage magnetic field LM1 and the leakage magnetic field LM2 are allowed to act on the magnetization free layer MFR, as will be described later, and are a few nm, for example.

The layer L2 of the reference layer REF is provided with an electrode layer UE thereon. The magnetization fixed layer MFX1 is provided with an electrode layer LE1 thereon. The magnetization fixed layer MFX2 is provided with an electrode layer LE2 thereon. The electrode layer UE, the electrode layer LE1, and the electrode layer LE2 function as terminals of the magnetoresistive effect element MR and are formed of, for example, a metal (e.g., copper).

Incidentally, a material for the magnetization free layer MFR, the magnetization fixed layer MFX1, and the magnetization fixed layer MFX2 is not limited in particular if each layer is the ferromagnetic body having the vertical magnetic anisotropy, but preferably contains at least one material selected out of Fe, Co and Ni. Further, for example, Pt or Pd may be contained in addition to these materials in the magnetization free layer MFR, the magnetization fixed layer MFX1, and the magnetization fixed layer MFX2. In this case, the vertical magnetic anisotropy of each of the above layers can be stabilized.

Further, the magnetization free layer MFR, the magnetization fixed layer MFX1, and the magnetization fixed layer MFX2 may contain, for example, B, C, N, O, Al, Si, P, Ti, V, Cr, Mn, Cu, Zn, Zr, Nb, Mo, Tc, Ru, Rh, Ag, Hf, Ta, W, Re, Os, Ir, Au or Sm in addition to the above materials. In this case, it is possible to allow the above-described layers to develop desired magnetic properties. The magnetization free layer MFR, the magnetization fixed layer MFX1, and the magnetization fixed layer MFX2 can be taken as, for example, Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd or Sm—Co.

Further, a layer containing any one material selected from Fe, Co and Ni may be superimposed on a different layer to develop the magnetic anisotropy in the vertical direction. Specifically, a laminated film of Co/Pd, Co/Pt, Co/Ni and Fe/Au is illustrated by way of example. In order to improve an S/N ratio of a read resistance by raising the magnetic resistance ratio of the magnetization free layer MFR, the magnetization free layer MFR may be formed as, for example, CoFe/MgO or CoFeB/MgO.

Figure 3:
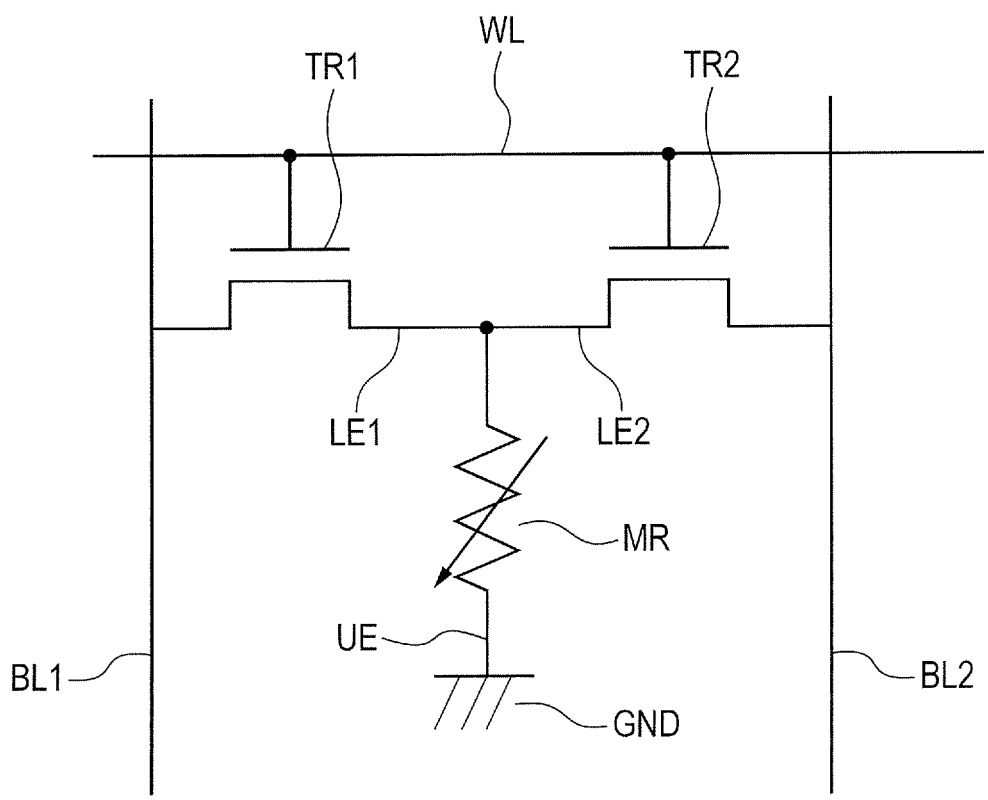
FIG. 3 is a circuit diagram of a magnetic memory cell according to the embodiment.

FIG. 3 is a circuit diagram of a magnetic memory cell MC according to the present embodiment. The magnetic memory cell MC includes a magnetoresistive effect element MR, a transistor TR1, a transistor TR2, a bit line BL1, a bit line BL2, and a word line WL.

An electrode layer UE of the magnetoresistive effect element MR is coupled to a ground line GND. Further, an electrode layer LE1 of the magnetoresistive effect element MR is coupled to a source or drain of the transistor TR1. On the other hand, an electrode layer LE2 of the magnetoresistive effect element MR is coupled to a source or drain of the transistor TR2.

A gate of the transistor TR1 and a gate of the transistor TR2 are coupled to the word line WL. Further, either the source or drain of the transistor TR1 is coupled to the magnetoresistive effect element MR as described above, and the other of the source or drain is coupled to the bit line BL1. Likewise, either the source or drain of the transistor TR2 is coupled to the magnetoresistive effect element MR, and the other of the source or drain is coupled to the bit line BL2.

Incidentally, in the present embodiment, a plurality of magnetic memory cells MC are disposed in an array form and coupled to circumferential circuits. A magnetic random access memory is formed in this manner.

A method of writing 0 or 1 and its advantageous effects in the present embodiment will next be described. FIGS. 4 to 7 are diagrams for describing operations of the magnetoresistive effect element MR and correspond to FIG. 2. Incidentally, in the example shown in FIGS. 4 to 7, information of 1 is assumed to be shown where the direction of the magnetization of the region RG1 of the magnetization free layer MFR corresponds to the −z-axis direction, and information of 0 is assumed to be shown where the direction of the magnetization of the region RG1 corresponds to the +z-axis direction.

Figure 4:
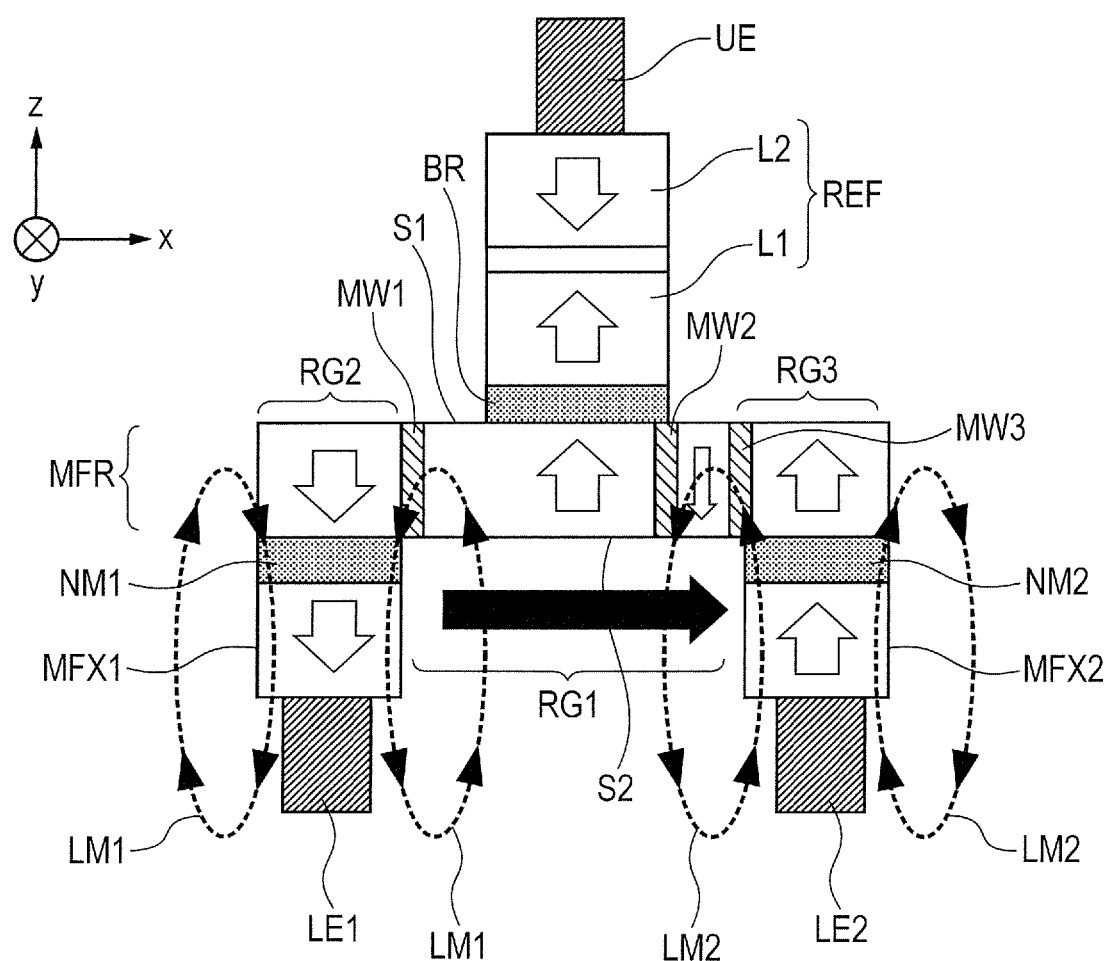
FIG. 4 is a diagram for describing an operation of the magnetoresistive effect element.
Figure 8C:
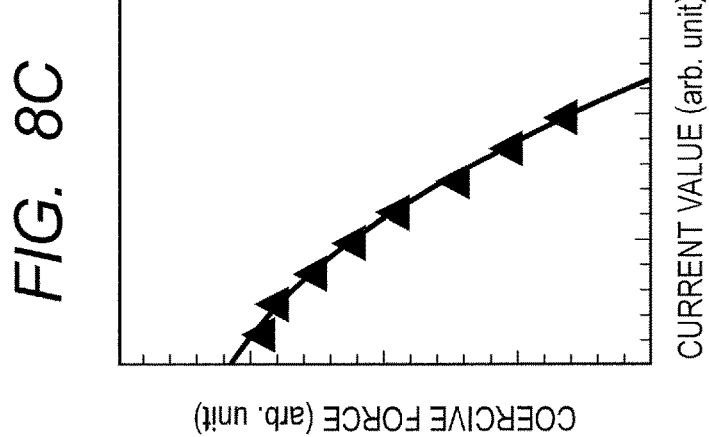
FIG. 8C is a graph illustrating one example of a current-coercive force relationship.
Figure 8B:
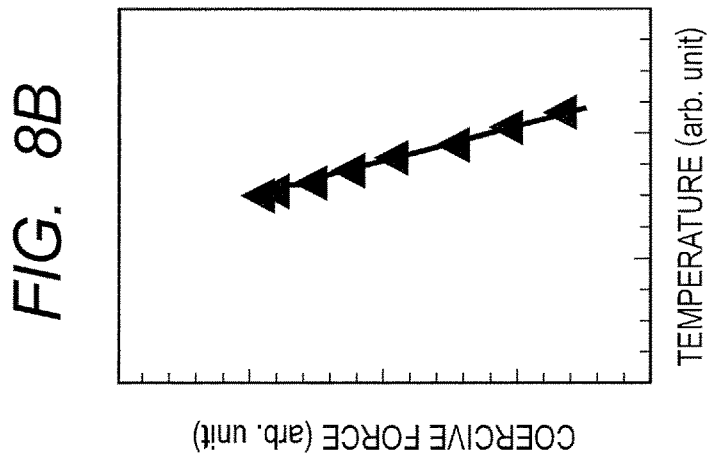
FIG. 8B is a graph illustrating one example of a temperature-coercive force relationship.
Figure 8A:
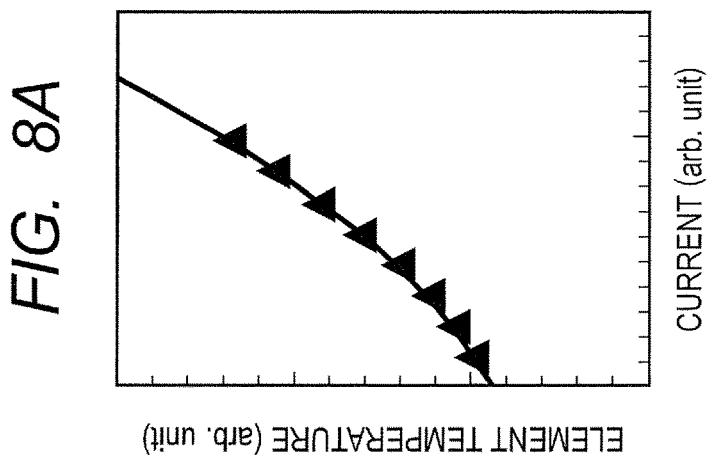
FIG. 8A is a graph illustrating one example of a current-element temperature relationship.

In the example illustrated in FIG. 4, the magnetization free layer MFR has the magnetic wall MW1 on the side of the magnetization fixed layer MFX1 in a state in which no current flows through the magnetization free layer MFR. In the example shown in the present figure, the current (shown by black arrow) is made to flow through the magnetization free layer MFR from the magnetization fixed layer MFX1 side. In this case, Joule heat is generated in the magnetization free layer MFR. Thus, an element temperature rises with an increase in the current as illustrated in FIG. 8A, for example. Further, the coercive force of the magnetization free layer MFR is reduced with a rise in temperature as illustrated in FIG. 8B, for example. Therefore, the coercive force of the magnetization free layer MFR is reduced with the increase in the current as illustrated in FIG. 8C, for example.

Figure 9:
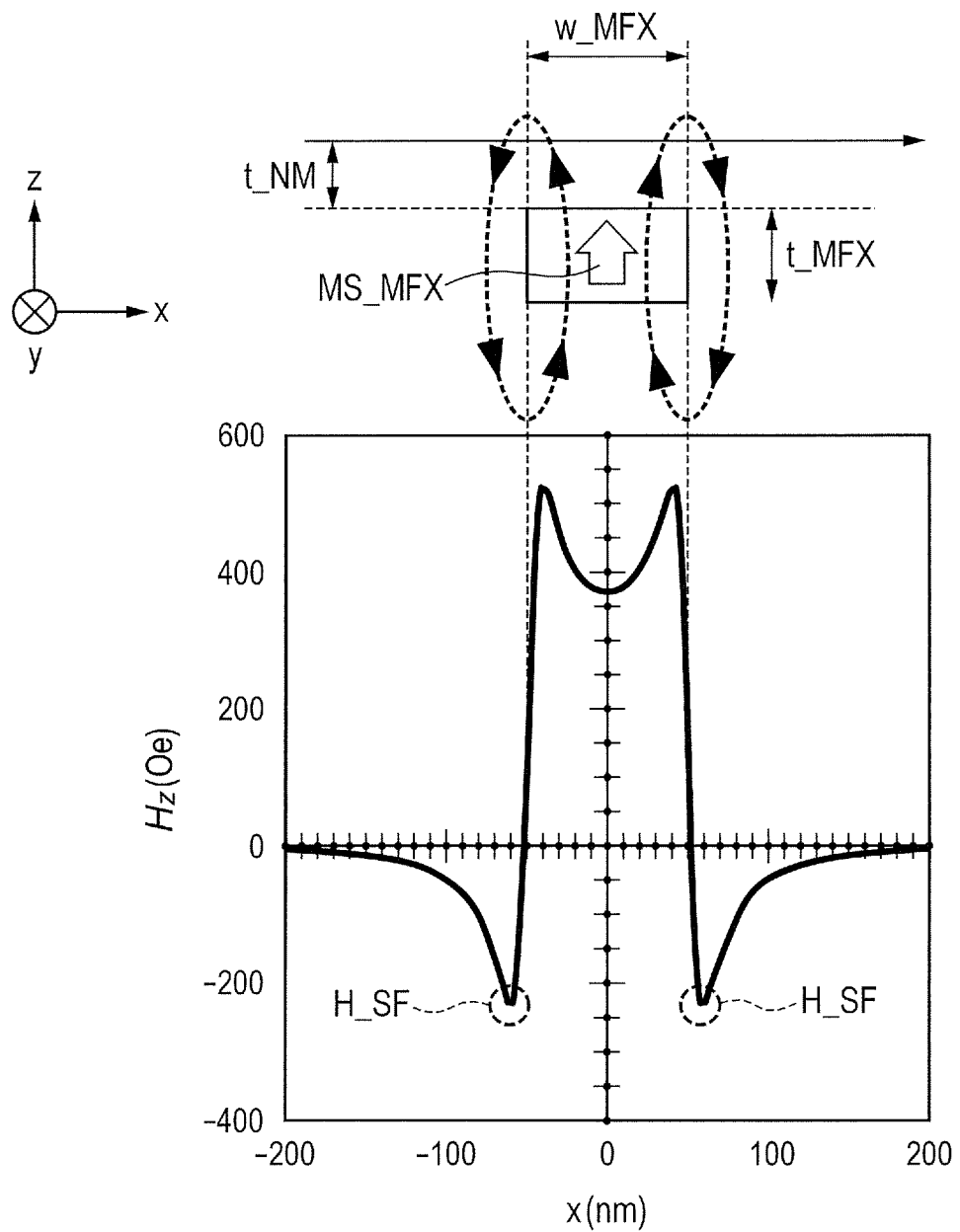
FIG. 9 is a diagram for describing a distribution of a leakage magnetic field.

Further, the magnetization fixed layer MFX2 generates the leakage magnetic field LM2 as illustrated in FIG. 9, for example. In the example illustrated in the present figure, the leakage magnetic field LM2 has a region in which a magnetic field component $H_z$ in the z-axis direction becomes negative in a region apart from the magnetization fixed layer MFX2 by a distance t_NM in the +z-axis direction. Further, the absolute value of the negative magnetic field component $H_z$ takes a maximum value H_SF. Incidentally, a similar phenomenon occurs even in the magnetization fixed layer MFX1. Further, the example illustrated in the present figure shows a calculation result where MS_MFX (magnetization of magnetization fixed layer MFX2)=580 emu/cc, t_MFX (thickness of magnetization fixed layer MFX2)=4 nm, w_MFX (width of magnetization fixed layer MFX2)=100 nm, and t_NM (corresponding to the thickness of nonmagnetic layer NM2 of FIG. 4)=5 nm.

Thus, in the example illustrated in FIG. 4, when the current flows in the magnetization free layer MFR, the coercive force of the magnetization free layer MFR is reduced. Further, the magnetization fixed layer MFX2 generates the leakage magnetic field LM2. The leakage magnetic field LM2 has the magnetic field component in the −z-axis direction in the neighborhood of the region RG3. Therefore, when the coercive force of the magnetization free layer MFR becomes smaller than the magnetic field component in the −z-axis direction of the leakage magnetic field LM2, the direction of the magnetization of the region RG3 is reversed into the −z-axis direction. As a result, a magnetic wall MW2 and a magnetic wall MW3 are generated in the boundary between a magnetization-reversed region and its peripheral region. Incidentally, in the example illustrated in the present figure, the magnetic wall MW3 is formed on the region RG3 side, and the magnetic wall MW2 faces the region RG3 via the magnetic wall MW3.

Then, spin torque acts on the magnetic wall MW2. Further, the magnetic wall moves in a direction reverse to the direction of the current. Therefore, the magnetic wall MW2 moves in the −x-axis direction. On the other hand, the magnetic wall MW3 remains stayed without almost moving. This is because the leakage magnetic field LM2 does not have a large magnetic field component in the +z-axis direction on the −x-axis direction side of the magnetic wall MW3. In order to move the magnetic wall MW3 in the −x-axis direction, the magnetization on the −x-axis direction side of the magnetic wall MW3 needs to be reversed from the −z-axis direction to the +z-axis direction. As described above, however, the distribution of the leakage magnetic field LM2 is in a state in which such reversal of magnetization is hard to occur. Therefore, the magnetic wall MW3 does not almost move.

Figure 5:
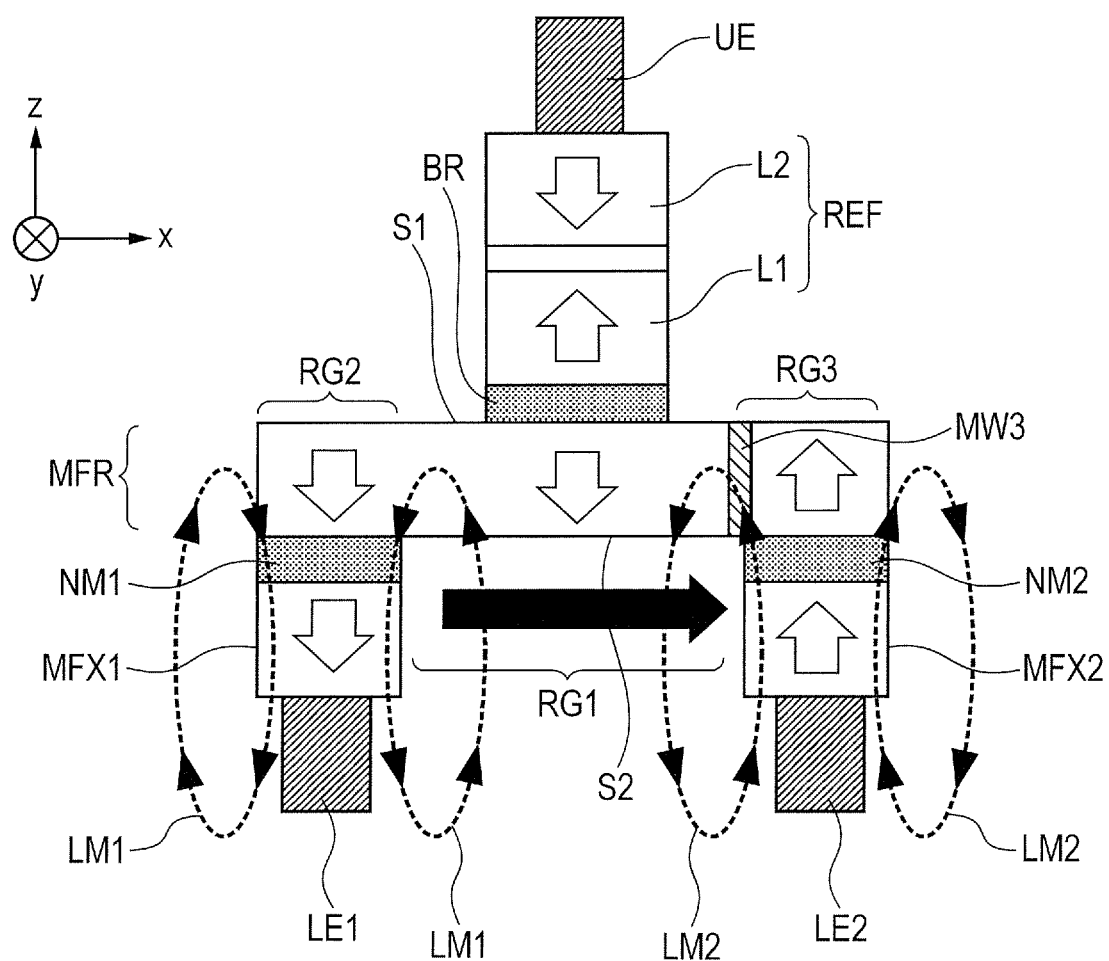
FIG. 5 is a diagram for describing an operation of the magnetoresistive effect element.
Figure 10:
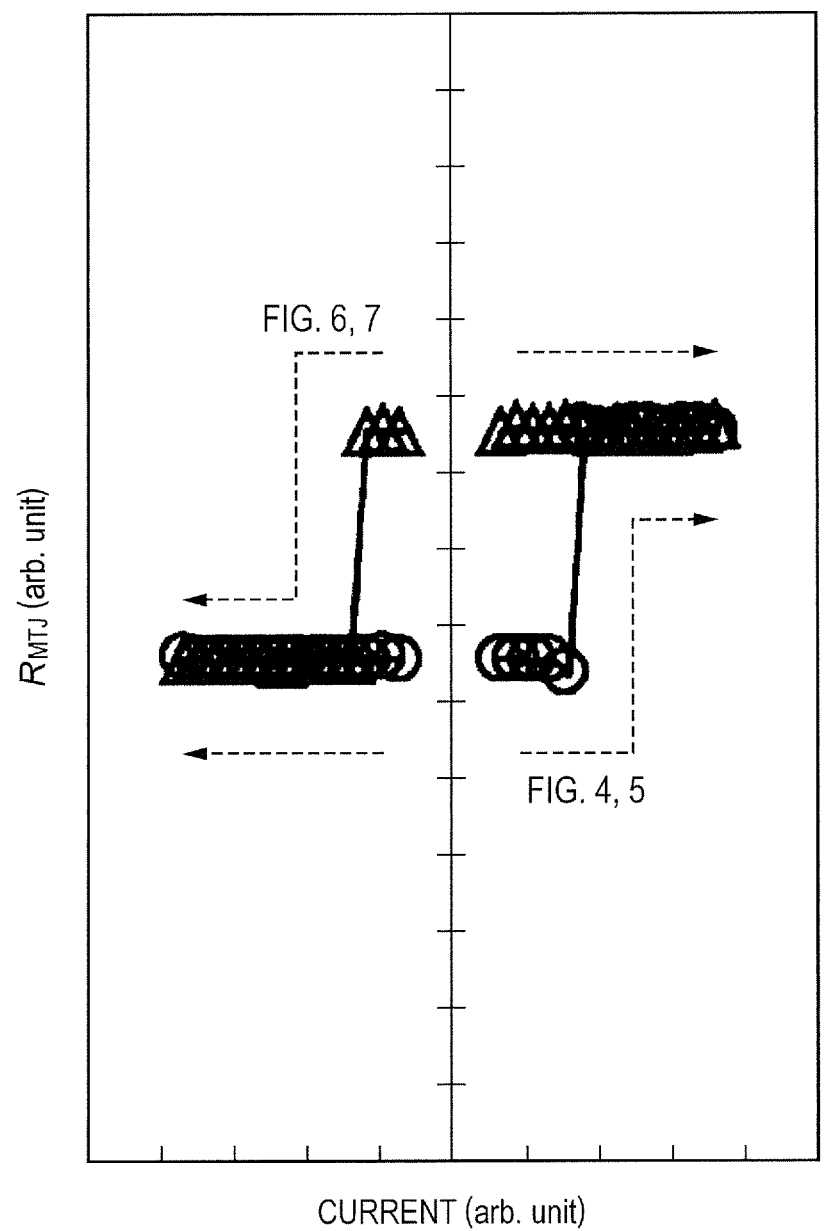
FIG. 10 is a graph showing one example of the current characteristics of a read resistance value of the magnetoresistive effect element.

Thus, the magnetic wall MW2 moves in the −x-axis direction. As a result, as shown in FIG. 5, the magnetization of the region RG1 of the magnetization free layer MFR is reversed from the +z-axis direction to the −z-axis direction. In this case, the electrical resistance $R_{MTJ}$ between the reference layer REF and the region RG1 of the magnetization free layer MFR changes from a low state to a high state as illustrated in FIG. 10, for example. That is, the information of 1 has been written into the magnetoresistive effect element MR.

Figure 6:
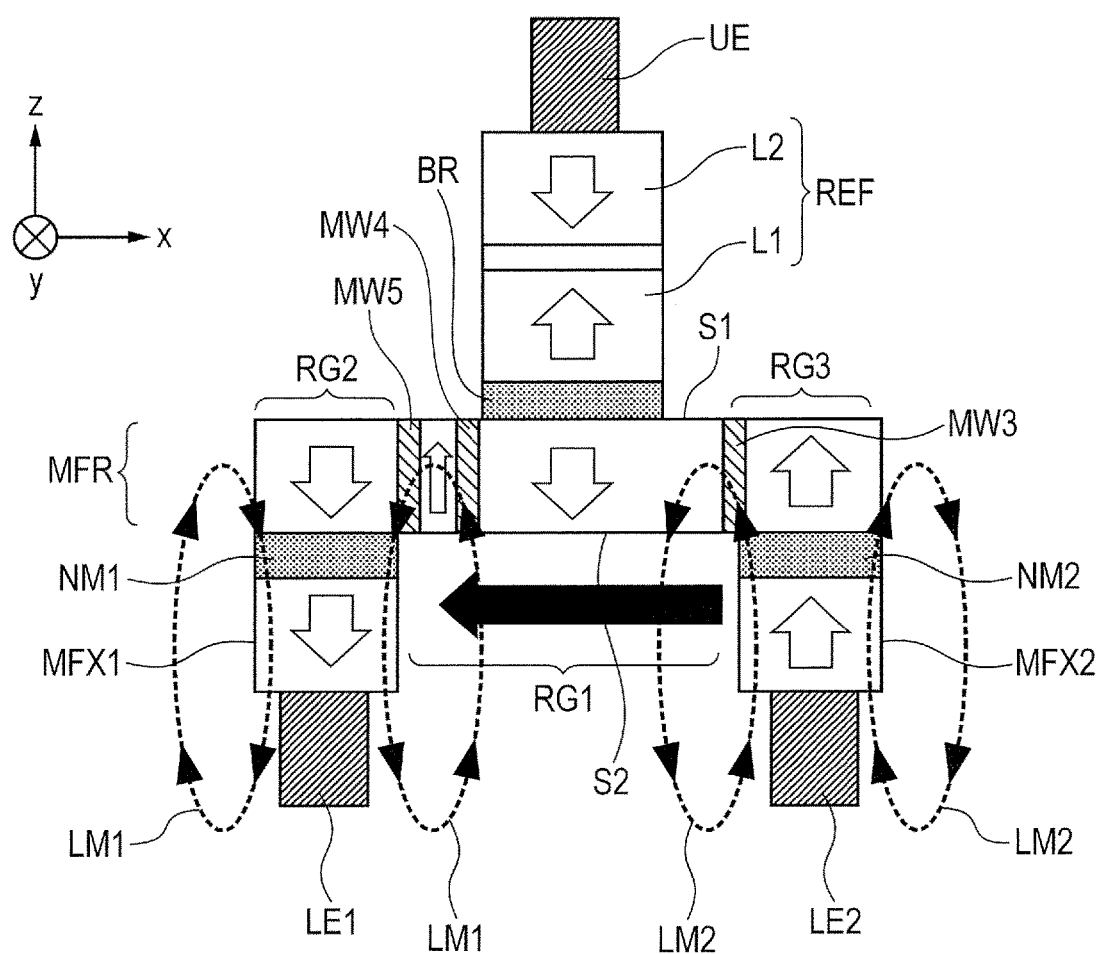
FIG. 6 is a diagram for describing an operation of the magnetoresistive effect element.

Even when the electrical resistance $R_{MTJ}$ between the reference layer REF and the region RG1 is changed from the high to low state, the magnetoresistive effect element MR is operated in like manner. In this case, as illustrated in FIG. 6, the current (shown by black arrow) is made to flow through the magnetization free layer MFR from the side of the magnetization fixed layer MFX2. Even in this case, magnetic walls MW4 and MW5 are generated in the vicinity of the region RG2 on the principle similar to the above principle. Incidentally, in the example illustrated in the present figure, the magnetic wall MW5 is formed on the side of the region RG2, and the magnetic wall MW4 is opposed to the region RG2 via the magnetic wall MW5.

Figure 7:
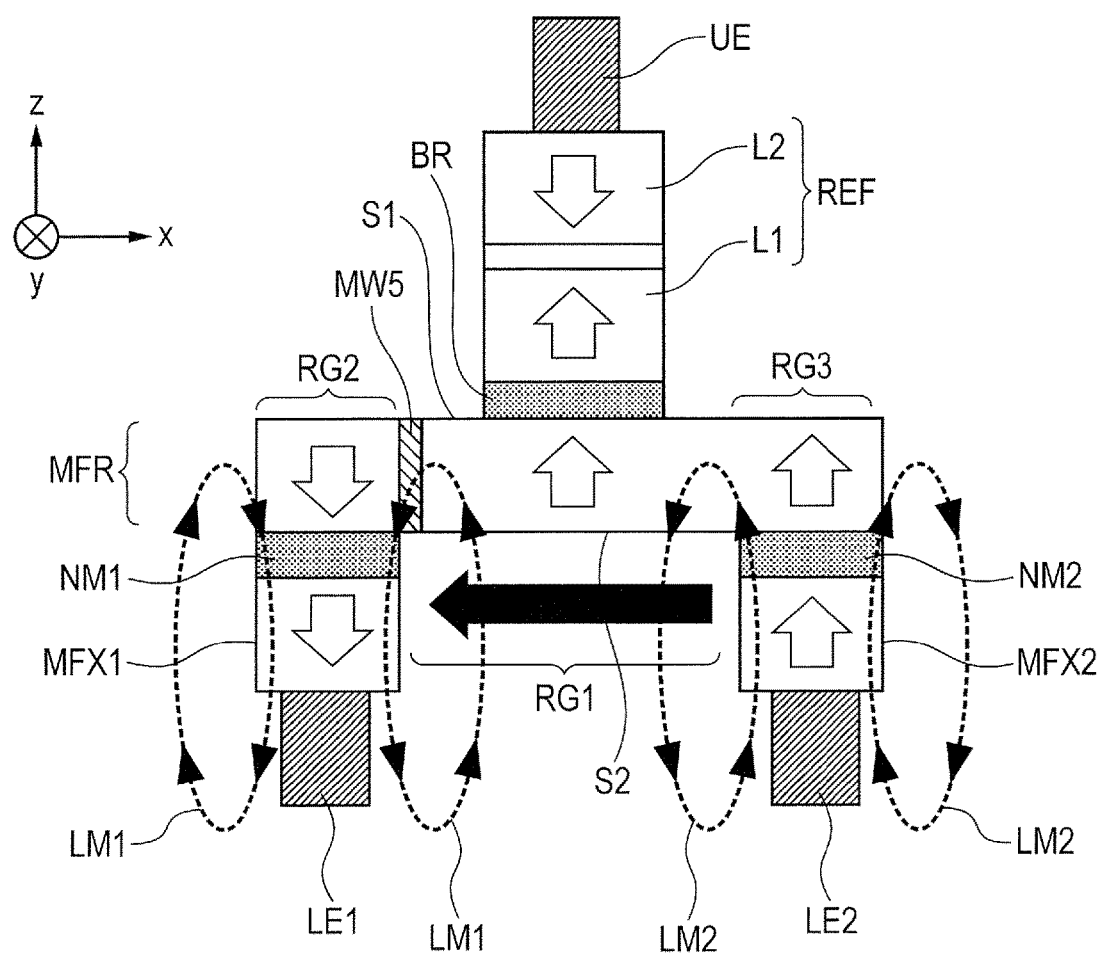
FIG. 7 is a diagram for describing an operation of the magnetoresistive effect element.

Then, the magnetic wall MW4 moves in the +x-axis direction by the spin torque. On the other hand, the magnetic wall MW5 remains stayed without almost moving. As a result, as shown in FIG. 7, the magnetization of the region RG1 of the magnetization free layer MFR is reversed from the −z-axis direction to the +z-axis direction. In this case, the electrical resistance $R_{MTJ}$ between the reference layer REF and the region RG1 of the magnetization free layer MFR changes from a high state to a low state as illustrated in FIG. 10, for example. That is, the information of 0 has been written into the magnetoresistive effect element MR.

Incidentally, in order to change the electrical resistance $R_{MTJ}$ between the reference layer REF and the region RG1 of the magnetization free layer MFR from the low state to the high state in the example shown in FIG. 4, there is also a case where the magnetic wall MW1 is moved in the +x-axis direction as described in Patent Document 1. In this case, however, it is necessary to make the current flow in the −x-axis direction. This is because the magnetic wall MW1 is moved contrary to the direction of the current. On the other hand, in the example shown in the present figure, when the above electrical resistance $R_{MTJ}$ is changed from the low to high state, the current is made to flow in the +x-axis direction. That is, in the example illustrated in the present figure, the direction of the current where the electrical resistance $R_{MTJ}$ is changed from the low state to the high state, becomes reverse to the direction of the current made to flow where the magnetic wall MW1 is moved. The same thing is established even in the example illustrated in FIG. 6.

Figure 11:
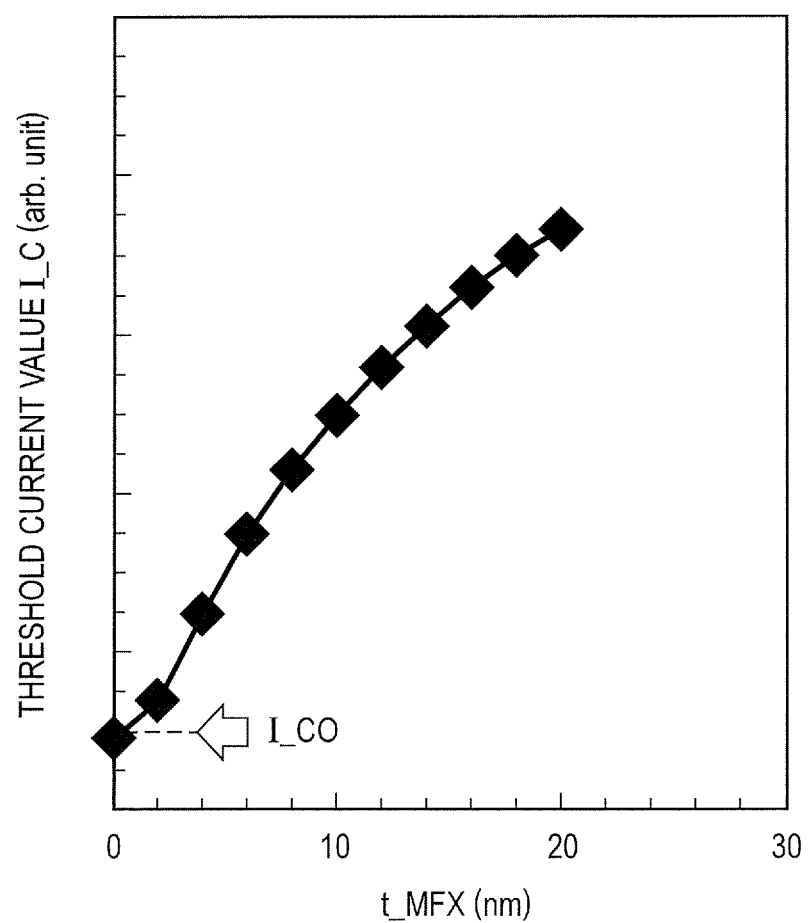
FIG. 11 is a graph showing one example of a relationship between the thickness of a magnetization fixed layer and a threshold current value.

Control on the current made to flow in the magnetization free layer MFR will be described in more detail using the example shown in FIG. 4. The magnetic wall MW1 is constrained by the region RG1 and the region RG2. Further, the magnetic wall MW1 is affected by the component in the x-axis direction of the leakage magnetic field LM1. As a result of examining the relationship between a threshold current value I_C for moving the magnetic wall MW1 and the thickness of the magnetization fixed layer MFX1, a result illustrated in FIG. 11 was obtained. The result illustrated in the present figure is obtained by solving a one-dimensional Landau-Lifshitz-Gilbert equation. As shown in the present figure, the threshold current value I_C increases with an increase in the thickness of the magnetization fixed layer MFX1. Here, the thickness of the magnetization fixed layer MFX1 is defined to be 0, i.e., the threshold current value in the state free of the constraint on the leakage magnetic field LM1 is defined to be I_C0.

FIG. 12 is a graph for describing conditions to generate the magnetic walls MW2 and MW3 in the magnetization free layer MFR in the example illustrated in FIG. 4. In FIG. 12, the lateral axis indicates a current value made to flow in the magnetization free layer MFR. On the other hand, the vertical axis indicates the difference between the coercive force H_C of the magnetization free layer MFR and the maximum value H_SF of the absolute value of the negative magnetic field component $H_z$ shown in FIG. 9.

The magnetic wall MW2 and the magnetic wall MW3 are generated where H_C—H_SF=0. At this time, the current flowing in the magnetization free layer MFR is defined to be I_DW (refer to FIG. 12). Further, the magnetic wall MW2 is influenced by the leakage magnetic field LM2 so that it is easy to move in the −x-axis direction. Therefore, the current for driving the magnetic wall MW2 is considered to be slightly smaller than I_C0.

In order to allow the generation of the magnetic walls MW2 and MW3 and the write operation to be performed simultaneously, there is a need to meet I_DW<I_C. Therefore, it is necessary to optimize the coercive force H_C of the magnetization free layer MFR or the magnetic field component H_SF of the leakage magnetic field LM2 and meet I_DW<I_C. Specifically, for example, a material suited to the magnetization free layer MFR can be selected. Also, a material suited to the magnetization fixed layer MFX2 may be selected or a shape appropriate to the magnetization fixed layer MFX2 may be formed. Further, the distance between the magnetization free layer MFR and the magnetization fixed layer MFX2 may be set to a suitable distance by adjusting the thickness of the non-magnetic layer NM2.

Figure 12A:
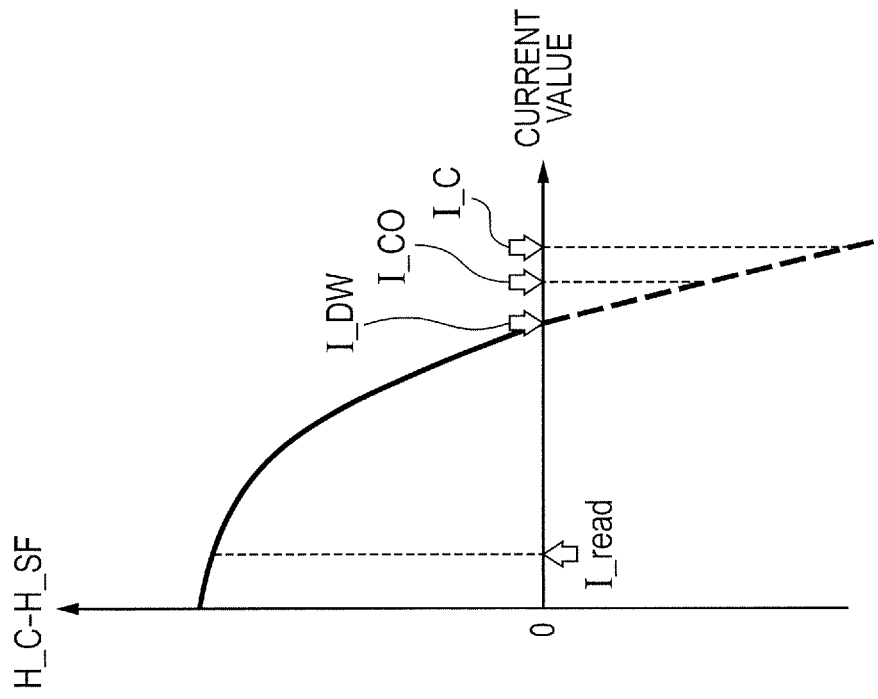
FIGS. 12A and 12B are graphs for describing conditions to generate magnetic walls in a magnetization free layer.
Figure 12B:
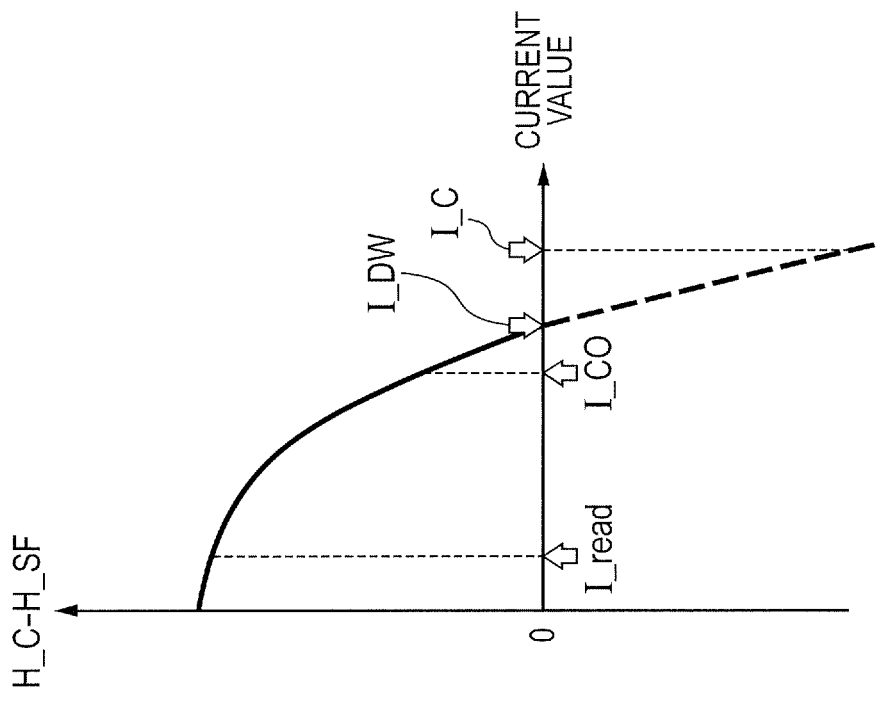

The current value flowing in the magnetization free layer MFR needs to meet the relationship shown in the present FIG. 12A or 12B. In the present FIG. 12A, I_C0<I_DW<I_C is satisfied. In this case, the current value necessary for writing becomes I_DW. On the other hand, in the present FIG. 12B, I_DW<I_C0<I_C is satisfied. In this case, the current value necessary for writing becomes I_C0.

Further, in order to suitably perform the writing, a sufficient margin is required between I_read and I_C0 in the example illustrated in the present FIG. 12A. I_read indicates a current value necessary for reading of the magnetoresistive effect element MR. Further, a sufficient margin is required even between I_DW and I_C. On the other hand, in the example illustrated in the present FIG. 12B, a sufficient margin is required between I_read and I_DW. Further, a sufficient margin is required even between I_C0 and I_C.

As described above, in the example illustrated in FIG. 4, the magnetic wall MW2 rather than the magnetic wall MW1 is moved to perform writing into the magnetoresistive effect element MR. Here, the magnetic wall MW1 receives large constraint from the leakage magnetic field LM1, whereas the magnetic wall MW2 is not so constrained by the leakage magnetic field LM2. For this reason, the current for driving the magnetic wall MW2 can be made smaller than the current for driving the magnetic wall MW1. Therefore, the current necessary for writing can be made small by driving the magnetic wall MW2 in place of the magnetic wall MW1. As a result, it is possible to reduce power consumption in the magnetoresistive effect element MR.

Figure 13:
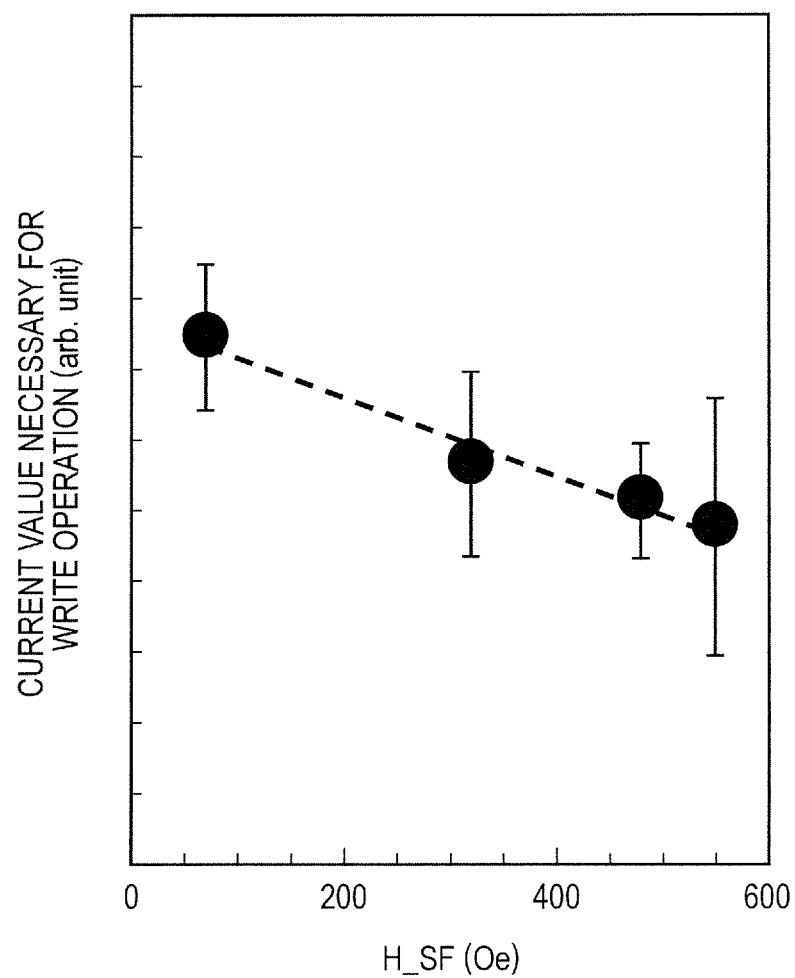
FIG. 13 is a graph showing one example of a relationship between a current value necessary for writing and a leakage magnetic field.

Further, in the example illustrated in FIG. 4, as shown in FIG. 13, the current value needed for write operation decreases with an increase in the maximum value H_SF of the absolute value of the negative magnetic field component $H_z$ shown in FIG. 9. Incidentally, in the example illustrated in FIG. 13, the thickness of the magnetization fixed layer MFX2 and the thickness of the non-magnetic layer NM2 are changed to vary H_SF.

To sum up the above, in the present embodiment, the direction of the current for making writing in the magnetoresistive effect element MR becomes opposite to the direction of the current where the initialized magnetic field (e.g., magnetic wall MW1 of FIG. 4) is driven. Further, in the present embodiment, the power consumption of the magnetoresistive effect element MR can be made low as compared with the case where the initialized magnetic field is driven.

Incidentally, in the present embodiment, the coercive force of the magnetization free layer MFR has been reduced by making the current to flow in the magnetization free layer MFR, but the method of reducing the coercive force of the magnetization free layer MFR is not limited to it. The coercive force of the magnetization free layer MFR can be reduced even by an effective magnetic field. When the magnetization free layer MFR contains, for example, Ta or Pt, an effective magnetic field acts in the longitudinal or lateral direction of the magnetization free layer MFR by, for example, the spin hole effect or Rashba interaction. This effective magnetic field is a magnetic field different from a current magnetic field generated by a current. This effective magnetic field enables the coercive force of the magnetization free layer MFR to be reduced. Therefore, the magnetic walls (e.g., magnetic walls MW2 and MW3) can be generated by the reduction in the coercive force of the magnetization free layer MFR by the effective magnetic field, and the leakage magnetic fields LM1 and LM2 from the magnetization fixed layer MFX1 and the magnetization fixed layer MFX2.

(Modification 1)

Figure 14:
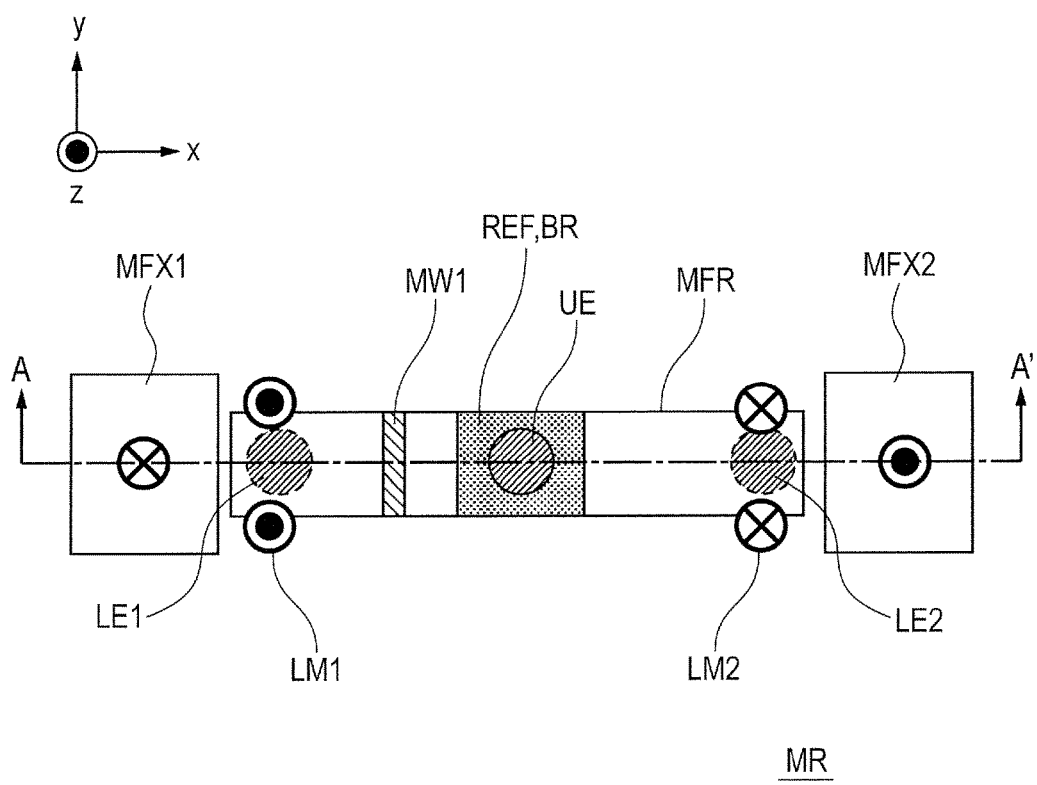
FIG. 14 is a plan diagram of a magnetoresistive effect element according to a modification 1.
Figure 15:
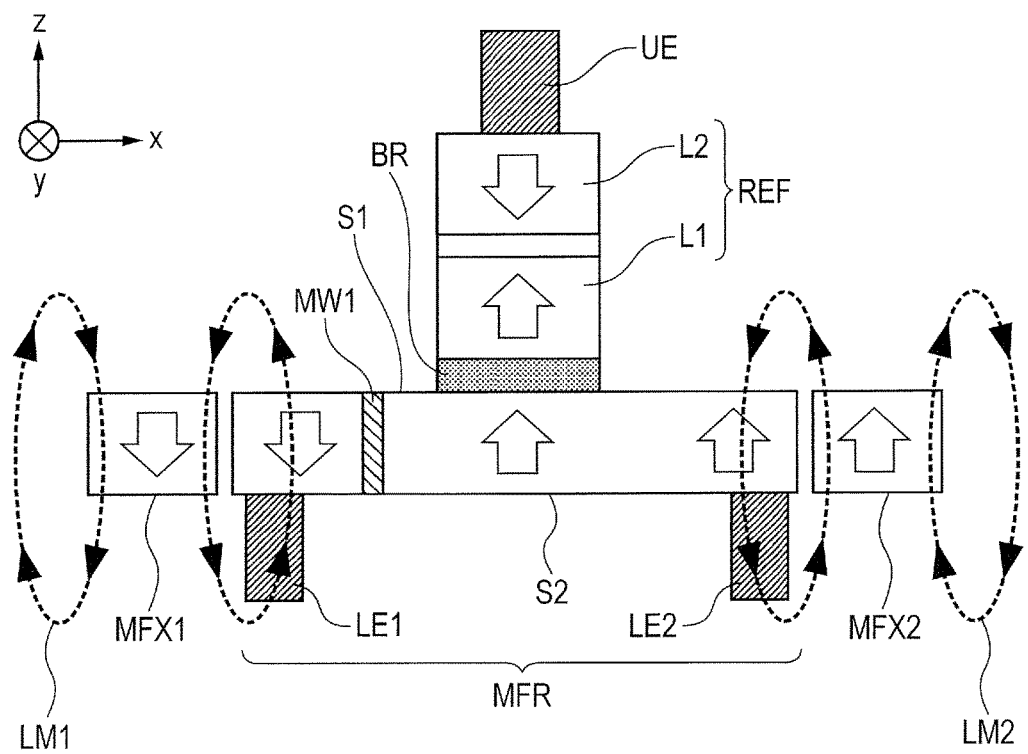
FIG. 15 is a cross-sectional diagram taken along line A-A' of FIG. 14.

FIG. 14 is a plan diagram of a magnetoresistive effect element MR according to a modification 1 and corresponds to FIG. 1 of the embodiment. FIG. 15 is a cross-sectional diagram taken along line A-A' of FIG. 14 and corresponds to FIG. 2 of the embodiment. The magnetoresistive effect element MR according to the present medication is similar in configuration to the magnetoresistive effect element MR according to the embodiment except for the following points.

In the present modification, a magnetization fixed layer MFX1 and a magnetization fixed layer MFX2 are provided in the vicinity of a magnetization free layer MFR. Also, the magnetization fixed layer MFX1 and the magnetization fixed layer MFX2 are opposed to each other via a reference layer REF as viewed from a z-axis direction. Further, the magnetization fixed layer MFX1 and the magnetization fixed layer MFX2 are not electrically coupled to the magnetization free layer MFR. For example, the magnetization fixed layer MFX1 and the magnetization fixed layer MFX2 may be made to float electrically. Incidentally, the magnetization of the magnetization fixed layer MFX1 is fixed in a −z-axis direction. On the other hand, the magnetization of the magnetization fixed layer MFX2 is fixed in a +z-axis direction. Further, wirings (electrode layer LE1 and electrode layer LE2) are coupled to the magnetization free layer MFR. Current is made to flow in the magnetization free layer MFR through the wirings. Incidentally, in the example illustrated in the present figure, since the non-magnetic layer NM1 and the non-magnetic layer NM2 do not exist, the electrode layer LE1 and the electrode layer LE2 are electrically coupled directly to the magnetization free layer MFR.

Described specifically, the magnetization fixed layer MFX1 and the magnetization fixed layer MFX2 are opposed to each other in an x-axis direction via the magnetization free layer MFR as seen from the z-axis direction. Further, the magnetization fixed layer MFX1 and the magnetization fixed layer MFX2 overlap with the magnetization free layer MFR as seen from the x-axis direction. Specifically, the magnetization fixed layer MFX1 and the magnetization fixed layer MFX2 are provided in the same layer as the magnetization free layer MFR. Even in this case, a leakage magnetic field LM1 and a leakage magnetic field LM2 are capable of acting on the magnetization free layer MFR in a manner similar to the embodiment.

Even in the present modification, the magnetoresistive effect element MR is capable of operating as with the embodiment using the leakage magnetic field LM1 and the leakage magnetic field LM2 and obtaining a similar effect to the embodiment.

(Modification 2)

Figure 16:
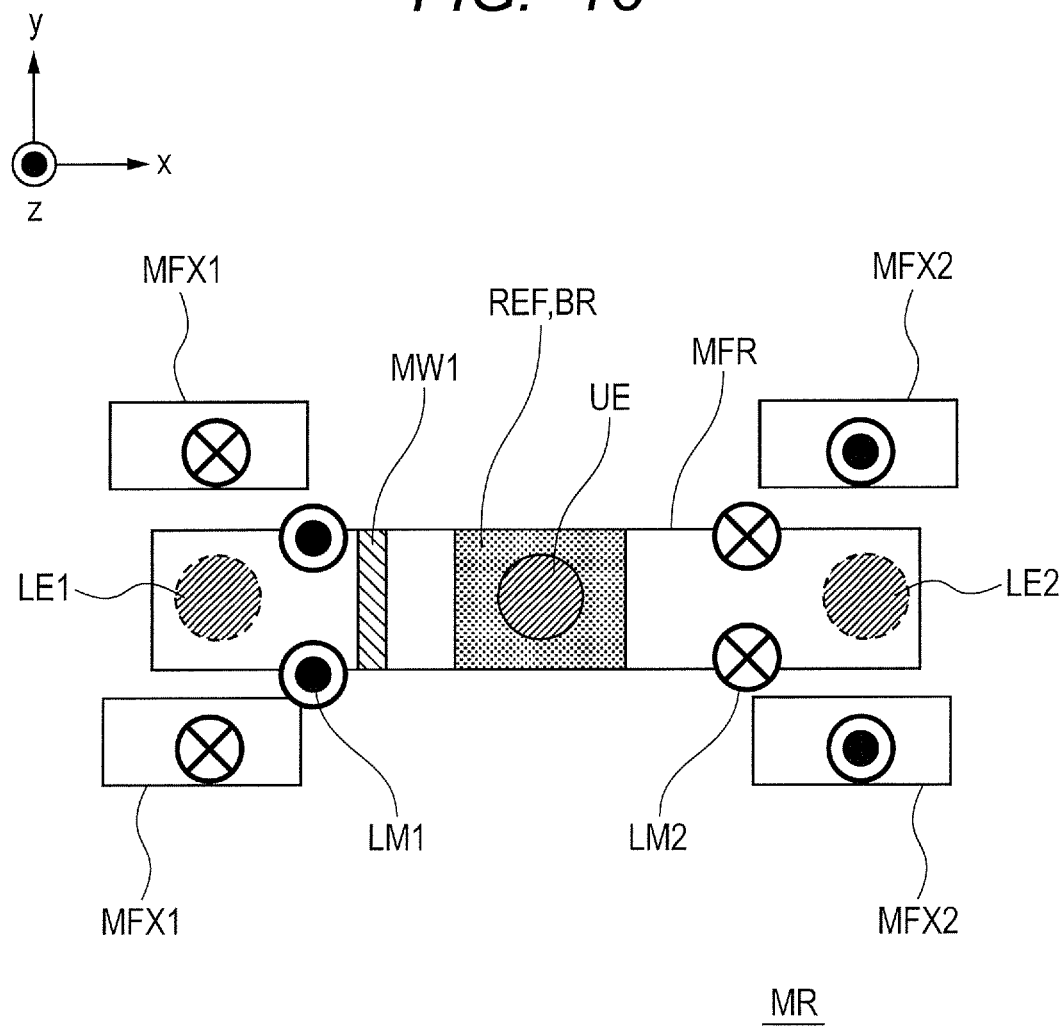
FIG. 16 is a plan diagram of a magnetoresistive effect element according to a modification 2.

FIG. 16 is a plan diagram of a magnetoresistive effect element MR according to a modification 2 and corresponds to FIG. 14 of the modification 1. The magnetoresistive effect element MR according to the present medication is similar in configuration to the magnetoresistive effect element MR according to the modification 1 except for the following points.

In the present modification, a magnetization fixed layer MFX1 is separated along ay-axis direction. Then, the separated magnetization fixed layers MFX1 sandwich one end of a magnetization free layer MFR therebetween in a y-axis direction as viewed from a z-axis direction. Likewise, a magnetization fixed layer MFX2 is also separated along the y-axis direction. Then, the separated magnetization fixed layers MFX2 sandwich the other end of the magnetization free layer MFR therebetween in the y-axis direction as seen from the z-axis direction. Even in this case, a leakage magnetic field LM1 and a leakage magnetic field LM2 can act on the magnetization free layer MFR as with the modification 1.

Even in the present modification, the magnetoresistive effect element MR is capable of operating as with the modification 1 using the leakage magnetic field LM1 and the leakage magnetic field LM2 and obtaining a similar effect to the modification 1. Further, in the present modification, the numbers of the magnetization fixed layers MFX1 and the magnetization fixed layers MFX2 around the magnetization free layer MFR increase as compared with the modification 1. Therefore, in the present modification, the component of the leakage magnetic field LM1 and the component of the leakage magnetic field LM2 both of which act on the magnetic free layer MFR can be made large as compared with the modification 1.

(Modification 3)

Figure 17:
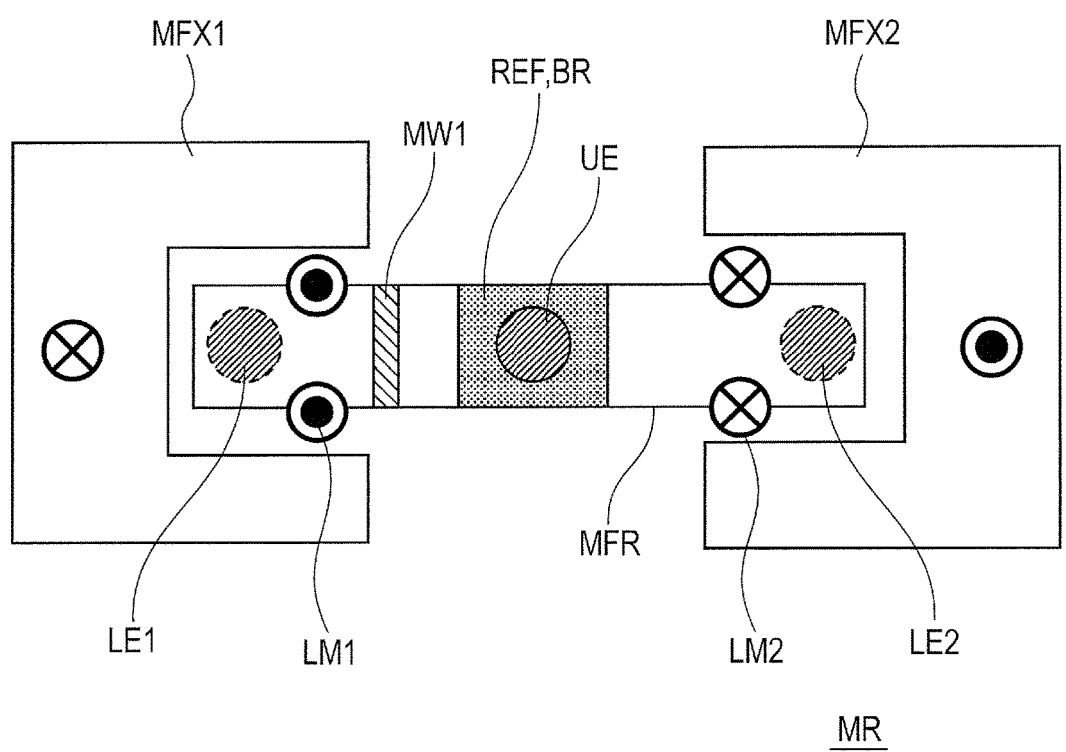
FIG. 17 is a plan diagram of a magnetoresistive effect element according to a modification 3.

FIG. 17 is a plan diagram of a magnetoresistive effect element MR according to a modification 3 and corresponds to FIG. 14 of the modification 1. The magnetoresistive effect element MR according to the present medication is similar in configuration to the magnetoresistive effect element MR according to the modification 1 except for the following points.

In the present modification, a magnetization fixed layer MFX1 surrounds one end in an x-axis direction of a magnetization free layer MFR as seen from a z-axis direction. Likewise, a magnetization fixed layer MFX2 surrounds the other end in the x-axis direction of the magnetization free layer MFR as seen from the z-axis direction. Even in this case, a leakage magnetic field LM1 and a leakage magnetic field LM2 are capable of acting on the magnetization free layer MFR as with the modification 1.

Even in the present modification, the magnetoresistive effect element MR is capable of operating as with the modification 1 using the leakage magnetic field LM1 and the leakage magnetic field LM2 and obtaining a similar effect to the modification 1. Further, in the present modification, the area of the magnetization fixed layer MFX1 and the area of the magnetization fixed layer MFX2 when seen from the z-axis direction become large as compared with the modification 1. Therefore, in the present medication, the component of the leakage magnetic field LM1 and the component of the leakage magnetic field LM2 both of which act on the magnetization free layer MFR can be made large as compared with the modification 1.

(Modification 4)

Figure 18:
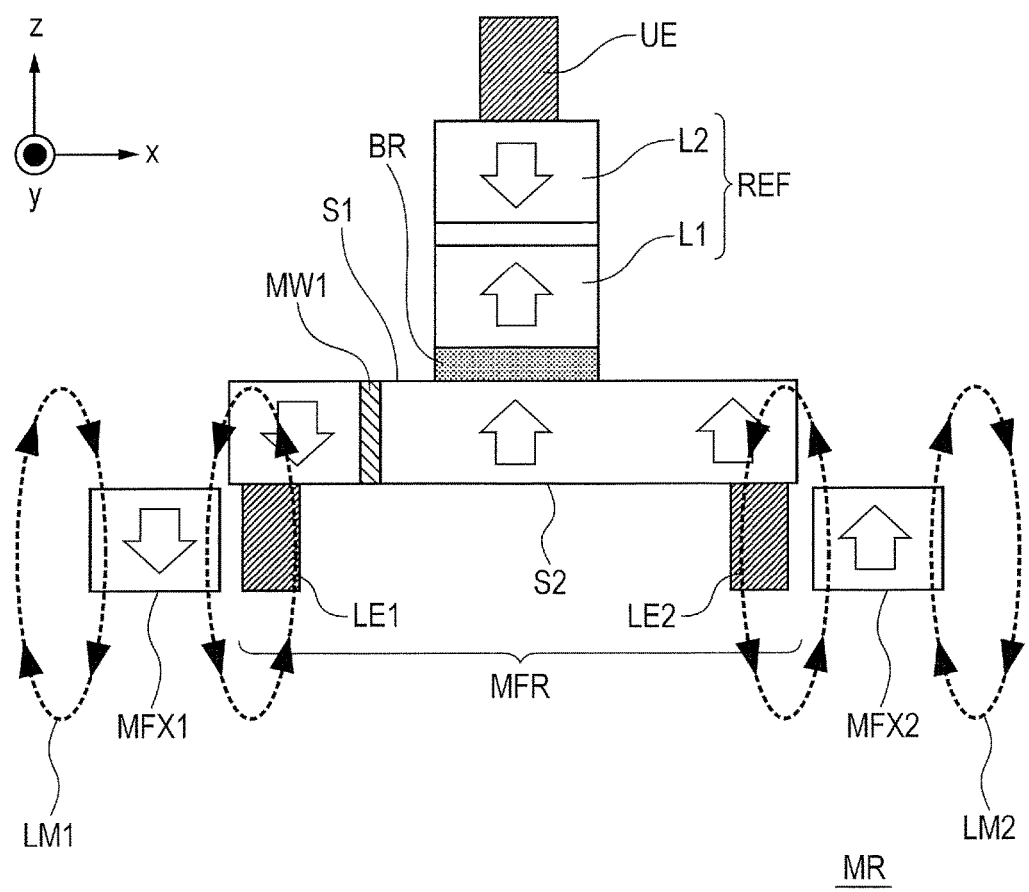
FIG. 18 is a cross-sectional diagram of a magnetoresistive effect element according to a modification 4.

FIG. 18 is a cross-sectional diagram of a magnetoresistive effect element MR according to a modification 4 and corresponds to FIG. 15 of the modification 1. The magnetoresistive effect element MR according to the present medication is similar in configuration to the magnetoresistive effect element MR according to the modification 1 except for the following points.

In the present modification, a magnetization fixed layer MFX1 is provided on the side opposite to a reference layer REF, of a magnetization free layer MFR as seen from a y-axis direction. Likewise, a magnetization fixed layer MFX2 is provided on the side opposite to the reference layer REF, of the magnetization free layer MFR as seen from the y-axis direction. Specifically, the magnetization fixed layer MFX1 and the magnetization fixed layer MFX2 are respectively provided in a lower layer of the magnetization free layer MFR. Even in this case, a leakage magnetic field LM1 and a leakage magnetic field LM2 are capable of acting on the magnetization free layer MFR as with the modification 1.

Even in the present modification, the magnetoresistive effect element MR is capable of operating as with the modification 1 using the leakage magnetic field LM1 and the leakage magnetic field LM2 and obtaining a similar effect to the modification 1.

(Modification 5)

Figure 19:
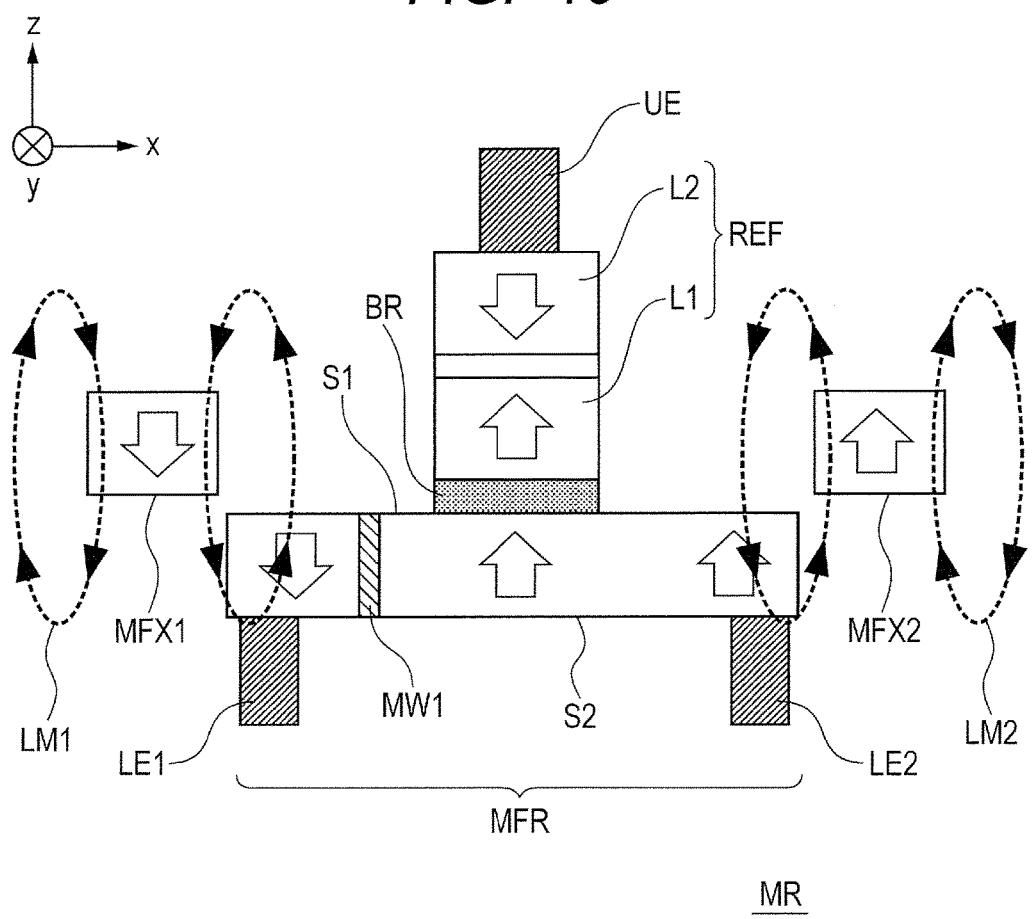
FIG. 19 is a cross-sectional diagram of a magnetoresistive effect element according to a modification 5.

FIG. 19 is a cross-sectional diagram of a magnetoresistive effect element MR according to a modification 5 and corresponds to FIG. 15 of the modification 1. The magnetoresistive effect element MR according to the present modification is similar in configuration to the magnetoresistive effect element MR according to the modification 1 except for the following points.

In the present modification, a magnetization fixed layer MFX1 is provided on the reference layer REF side of a magnetization free layer MFR as seen from a y-axis direction. Likewise, a magnetization fixed layer MFX2 is provided on the reference layer REF side of the magnetization free layer MFR as viewed from the y-axis direction. Specifically, the magnetization fixed layer MFX1 and the magnetization fixed layer MFX2 are provided in an upper layer of the magnetization free layer MFR. Even in this case, a leakage magnetic field LM1 and a leakage magnetic field LM2 are capable of acting on the magnetization free layer MFR as with the modification 1.

Even in the present modification, the magnetoresistive effect element MR is capable of operating as with the modification 1 using the leakage magnetic field LM1 and the leakage magnetic field LM2 and obtaining a similar effect to the modification 1.

(Modification 6)

Figure 20:
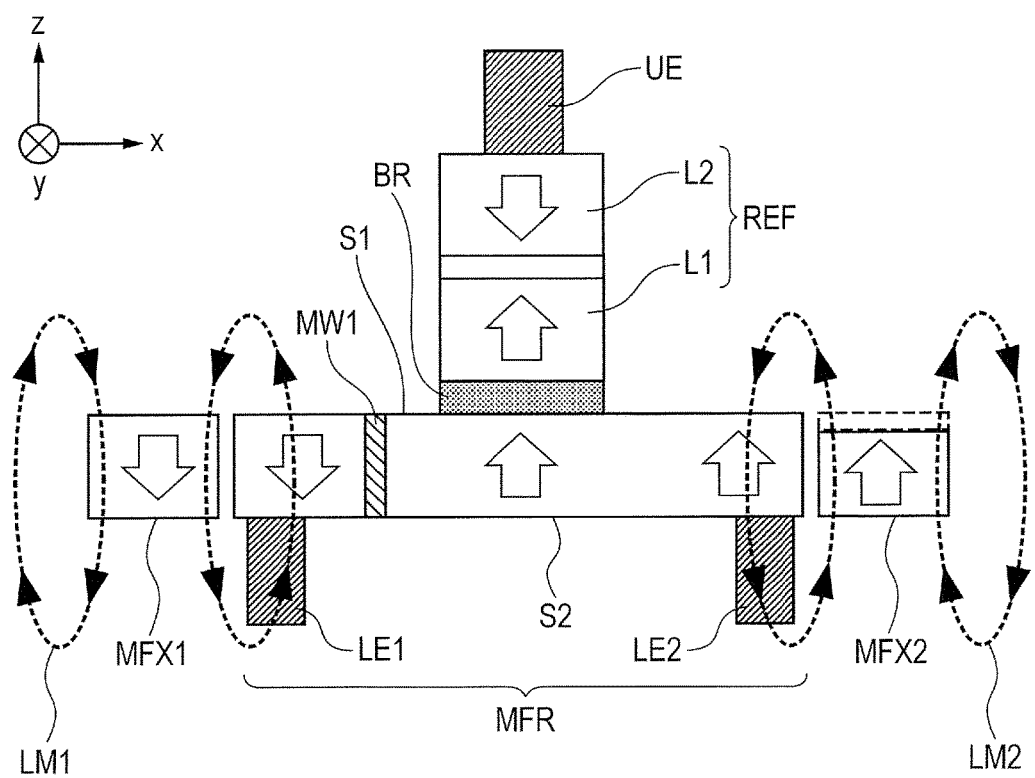
FIG. 20 is a cross-sectional diagram of a magnetoresistive effect element according to a modification 6.

FIG. 20 is a cross-sectional diagram of a magnetoresistive effect element MR according to a modification 6 and corresponds to FIG. 15 of the modification 1. The magnetoresistive effect element MR according to the present modification is similar in configuration to the magnetoresistive effect element MR according to the modification 1 except for the following points.

In the present modification, a magnetization fixed layer MFX1 and a magnetization fixed layer MFX2 are formed of the same material. Then, part of the magnetization field layer MFX2 is etched. Thus, the coercive force of the magnetization fixed layer MFX2 can be made smaller than that of the magnetization fixed layer MFX1. As a result, the direction of magnetization of the magnetization fixed layer MFX1 and the direction of magnetization of the magnetization fixed layer MFX2 can be made antiparallel to each other. Even in this case, a leakage magnetic field LM1 and a leakage magnetic field LM2 are capable of acting on a magnetization free layer MFR as with the modification 1.

Even in the present modification, the magnetoresistive effect element MR is capable of operating as with the modification 1 using the leakage magnetic field LM1 and the leakage magnetic field LM2 and obtaining a similar effect to the modification 1.

(Modification 7)

Figure 21:
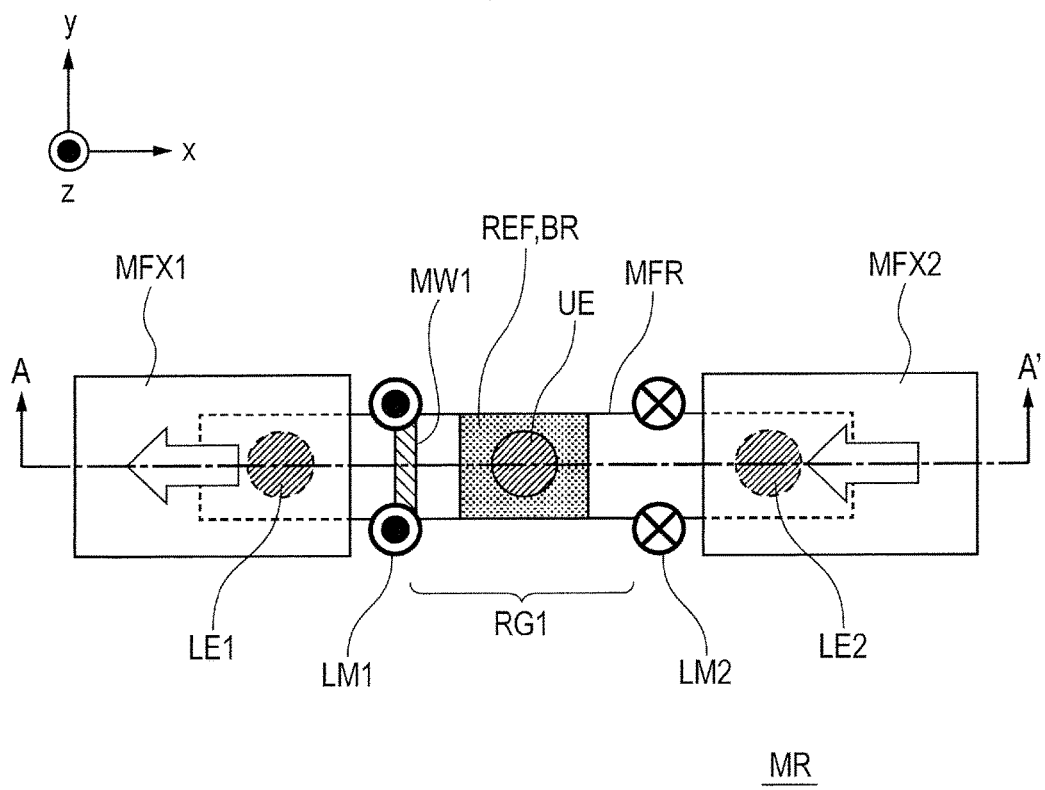
FIG. 21 is a plan diagram of a magnetoresistive effect element according to a modification 7.
Figure 22:
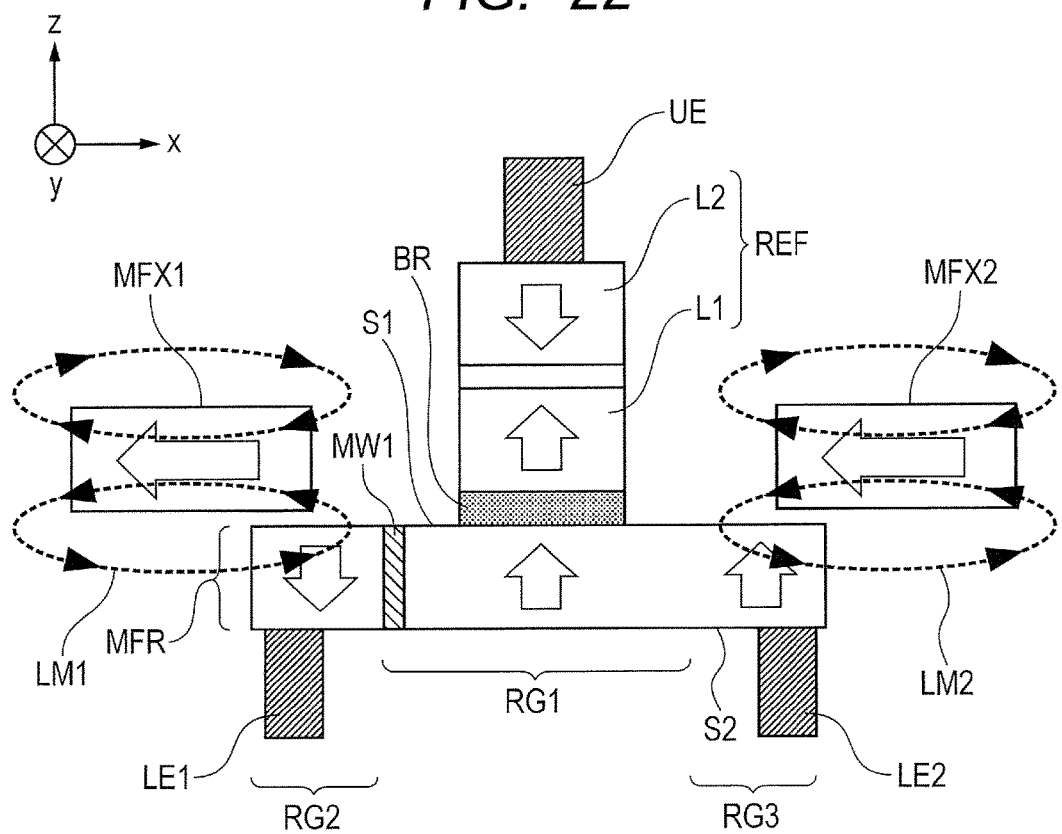
FIG. 22 is a cross-sectional diagram taken along line A-A' of FIG. 21.

FIG. 21 is a plan diagram of a magnetoresistive effect element MR according to a modification 7 and corresponds to FIG. 14 of the modification 1. FIG. 22 is a cross-sectional diagram taken along line A-A' of FIG. 21 and corresponds to FIG. 15 of the modification 1. The magnetoresistive effect element MR according to the present modification is similar in configuration to the magnetoresistive effect element MR according to the modification 1 except for the following points.

In the present modification, a magnetization fixed layer MFX1 overlaps with at least part of a region RG2 of a magnetization free layer MFR as seen from a z-axis direction. Likewise, a magnetization fixed layer MFX2 overlaps with at least part of a region RG3 of the magnetization free layer MFR as seen from the z-axis direction. Further, the magnetization fixed layer MFX1 and the magnetization fixed layer MFX2 are provided on the reference layer REF side of the magnetization free layer MFR as seen from a y-axis direction. Specifically, the magnetization fixed layer MFX1 and the magnetization fixed layer MFX2 are provided in an upper layer of the magnetization free layer MFR. Further, the direction of magnetization of the magnetization fixed layer MFX1 and the direction of magnetization of the magnetization fixed layer MFX2 are fixed in a −x-axis direction. Even in this case, a leakage magnetic field LM1 and a leakage magnetic field LM2 are capable of acting on the magnetization free layer MFR as with the modification 1.

Even in the present medication, the magnetoresistive effect element MR is capable of operating as with the modification 1 using the leakage magnetic field LM1 and the leakage magnetic field LM2 and obtaining a similar effect to the modification 1.

(Modification 8)

Figure 23:
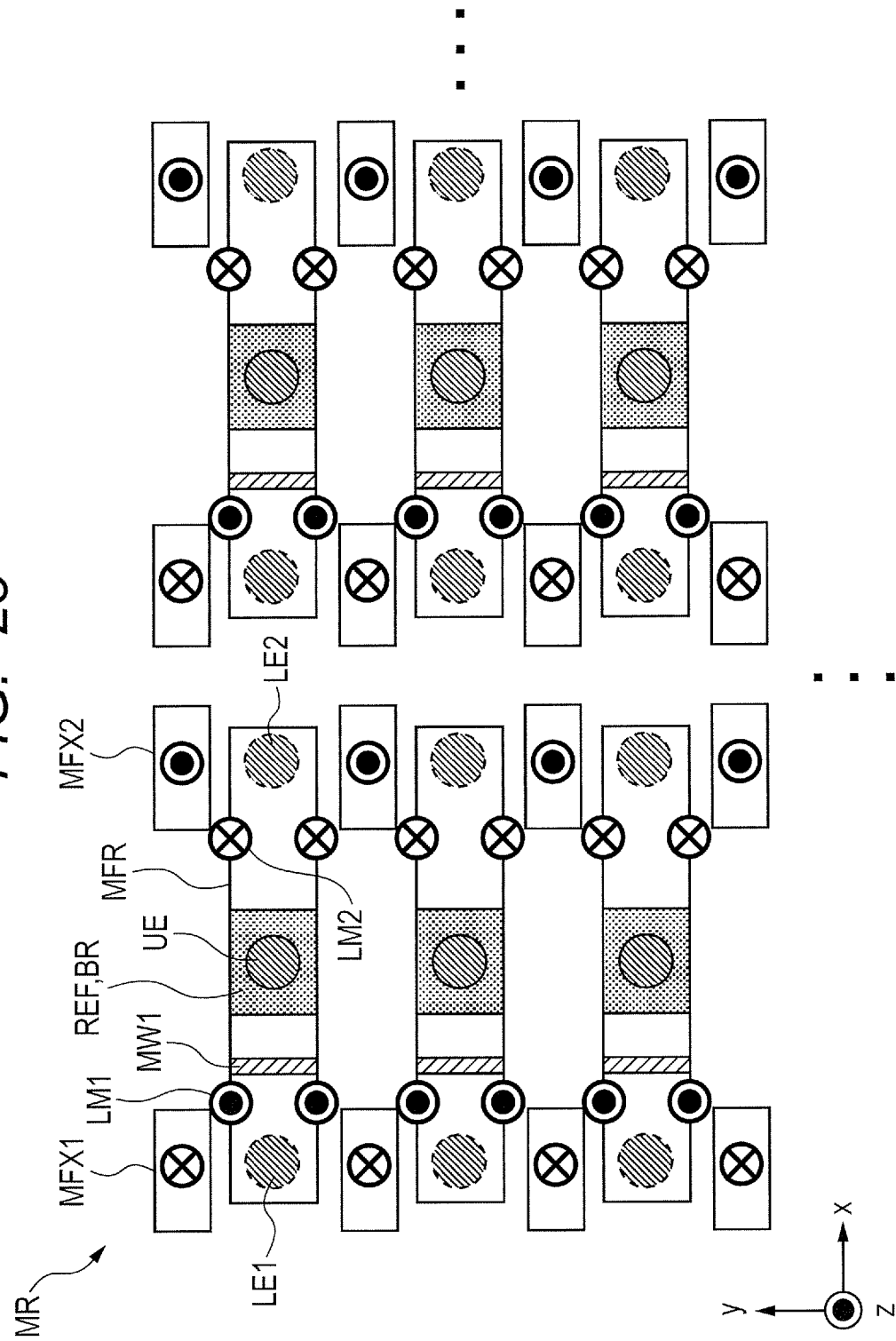
FIG. 23 is a plan diagram of a magnetoresistive effect element according to a modification 8.

FIG. 23 is a plan diagram of a magnetoresistive effect element MR according to a modification 8 and corresponds to FIG. 16 of the modification 2. The magnetoresistive effect element MR according to the present modification is similar in configuration to the magnetoresistive effect element MR according to the modification 2 except for the following points.

In the present modification, a plurality of magnetization free layers MFR are arranged in a y-axis direction as seen from a z-axis direction. Further, in the example illustrated in the present figure, a plurality of magnetization free layers MFR are arranged even in an x-axis direction as seen from the z-axis direction. Then, each of the magnetization free layers MFR has a longitudinal direction in the x-axis direction as viewed from the z-axis direction. Further, the magnetization free layers MFR and magnetization fixed layers MFX1 are alternately provided in the y-axis direction. Likewise, the magnetization free layers MFR and magnetization fixed layers MFX2 are alternately provided. Even in this case, a leakage magnetic field LM1 and a leakage magnetic field LM2 are capable of acting on each magnetization free layer MFR as with the modification 2.

Even in the present modification, the magnetoresistive effect element MR is capable of operating as with the modification 2 using the leakage magnetic fields LM1 and LM2 and obtaining a similar effect to the modification 2. Further, in the present modification, the magnetization free layers MFR adjacent to each other in the y-axis direction sandwich the magnetization fixed layer MFX1 therebetween in the y-axis direction and share the magnetization fixed layer MFX1. Further, the adjacent magnetization free layers MFR sandwich the magnetization fixed layer MFX2 therebetween in the y-axis direction and share the magnetization fixed layer MFX2. It is therefore possible to reduce the area per unit cell. As a result, it is possible to realize large capacity of a memory.

(Modification 9)

Figure 24:
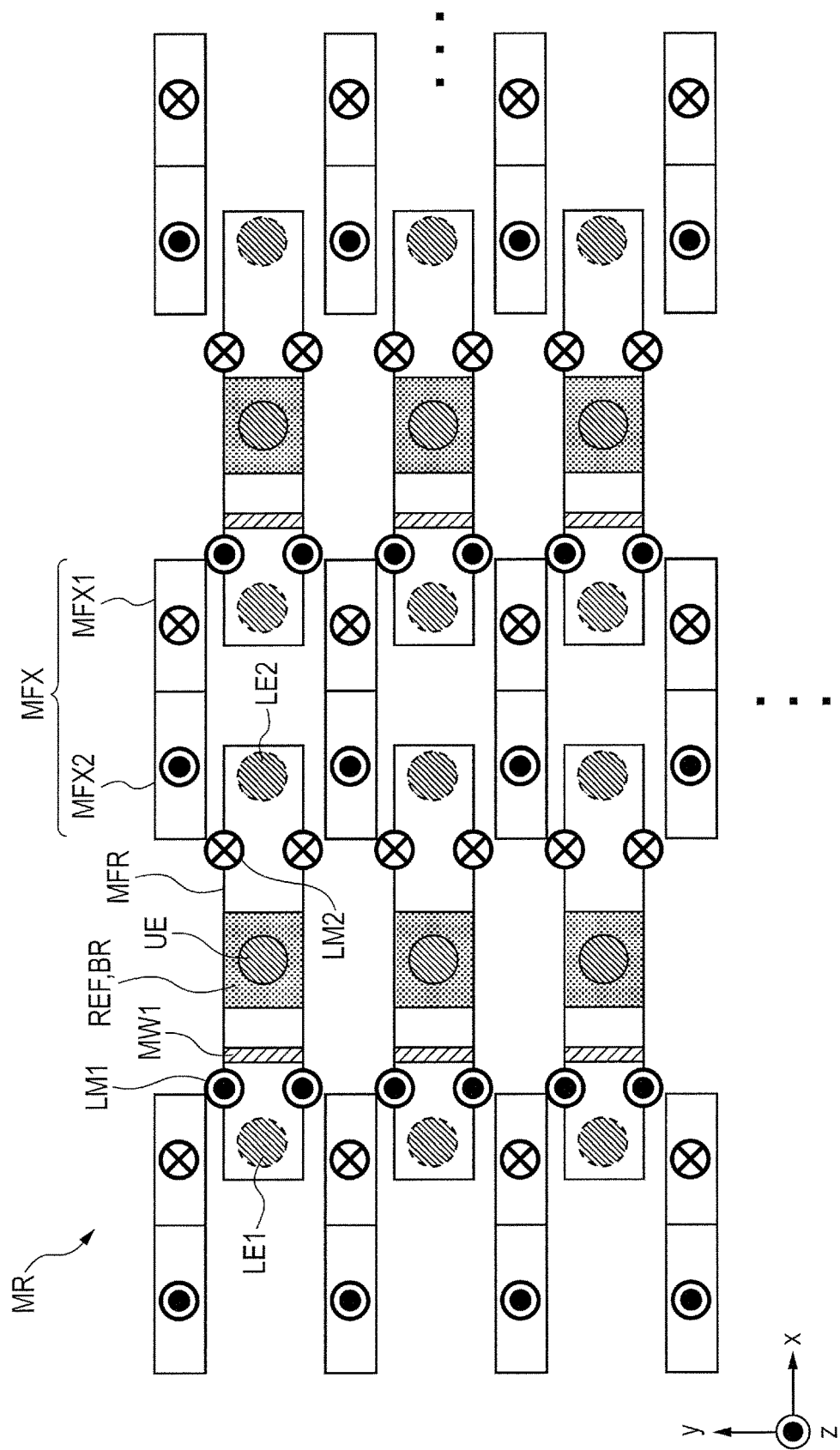
FIG. 24 is a plan diagram of a magnetoresistive effect element according to a modification 9.
Figure 25:
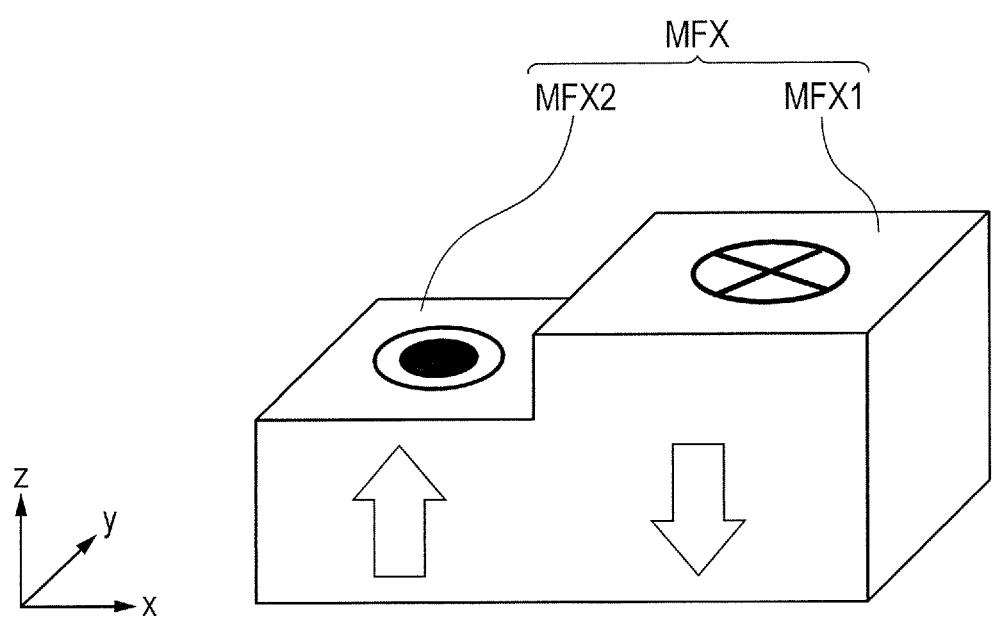
FIG. 25 is an enlarged perspective diagram of a magnetization fixed layer of FIG. 24.

FIG. 24 is a plan diagram of a magnetoresistive effect element MR according to a modification 9 and corresponds to FIG. 23 of the modification 8. FIG. 25 is an enlarged perspective diagram of each magnetization fixed layer MFX of FIG. 24. The magnetoresistive effect element MR according to the present modification is similar in configuration to the magnetoresistive effect element MR according to the modification 8 except for the following points.

In the present modification, a magnetization fixed layer MFX1 and a magnetization fixed layer MFX2 are integrated to configure the magnetization fixed layer MFX. That is, the magnetization fixed layer MFX1 and the magnetization fixed layer MFX2 are formed of the same material. In the example illustrated in the present figure, part of each magnetization fixed layer MFX is etched. Further, in a manner similar to the magnetization fixed layer MFX2 of the modification 6, the etched part of the magnetization fixed layer MFX serves as the magnetization fixed layer MFX2, and the non-etched part of the magnetization fixed layer MFX serves as the magnetization fixed layer MFX1. Even in this case, a leakage magnetic field LM1 and a leakage magnetic field LM2 are capable of acting on each magnetization free layer MFR as with the modification 8.

Even in the present modification, the magnetoresistive effect element MR is capable of operating as with the modification 8 using the leakage magnetic fields LM1 and the leakage magnetic fields LM2 and obtaining a similar effect to the modification 8. Further, in the present modification, the magnetization fixed layers MFX are formed from one of the magnetization free layers MFR adjacent in an x-axis direction to the other thereof. As a result, the magnetization free layers MFR adjacent to each other in the x-axis direction use the common magnetization fixed layer MFX. Therefore, the area per unit cell can be further reduced. As a result, it is possible to realize larger capacity of a memory.

(Modification 10)

Figure 26:
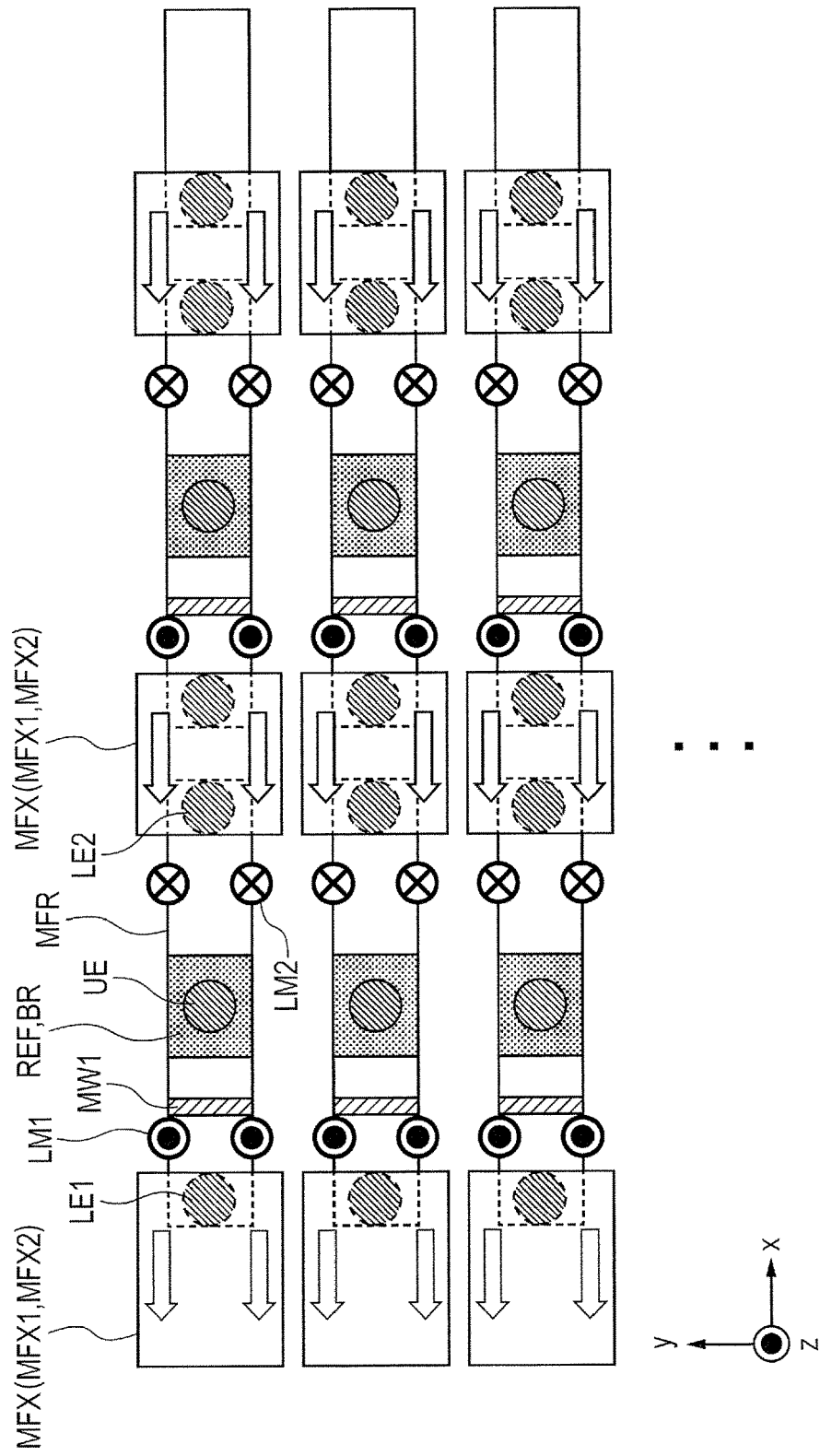
FIG. 26 is a plan diagram of a magnetoresistive effect element according to a modification 10.

FIG. 26 is a plan diagram of a magnetoresistive effect element MR according to a modification 10 and corresponds to FIG. 21 of the modification 7. The magnetoresistive effect element MR according to the present modification is similar in configuration to the magnetoresistive effect element MR according to the modification 7 except for the following points.

In the present modification, a plurality of magnetization free layers MFR are arranged in an x-axis direction as seen from a z-axis direction. Further, in the example illustrated in the present figure, a plurality of magnetization free layers MFR are arranged even in a y-axis direction as seen from the z-axis direction. Each of the magnetization free layers MFR has a longitudinal direction in the x-axis direction as viewed from the z-axis direction. Further, in the magnetization free layers MFR adjacent to each other in the x-axis direction, a magnetization fixed layer MFX2 of one of the magnetization free layers MFR and a magnetization fixed layer MFX1 of the other thereof become the same magnetization fixed layer MFX. Then, the magnetization fixed layer MFX extends from one magnetization free layer MFR to the other magnetization free layer MFR as viewed from the z-axis direction. Even in this case, a leakage magnetic field LM1 and a leakage magnetic field LM2 are capable of acting on each magnetization free layer MFR as with the modification 7.

Even in the present modification, the magnetoresistive effect element MR is capable of operating as with the modification 7 using the leakage magnetic fields LM1 and LM2 and obtaining a similar effect to the modification 7. Further, in the present modification, the magnetization free layers MFR adjacent to each other in the x-axis direction use the common magnetization fixed layer MFX. Therefore, the area per unit cell can be reduced. As a result, it is possible to realize larger capacity of a memory.

(Modification 11)

Figure 27:
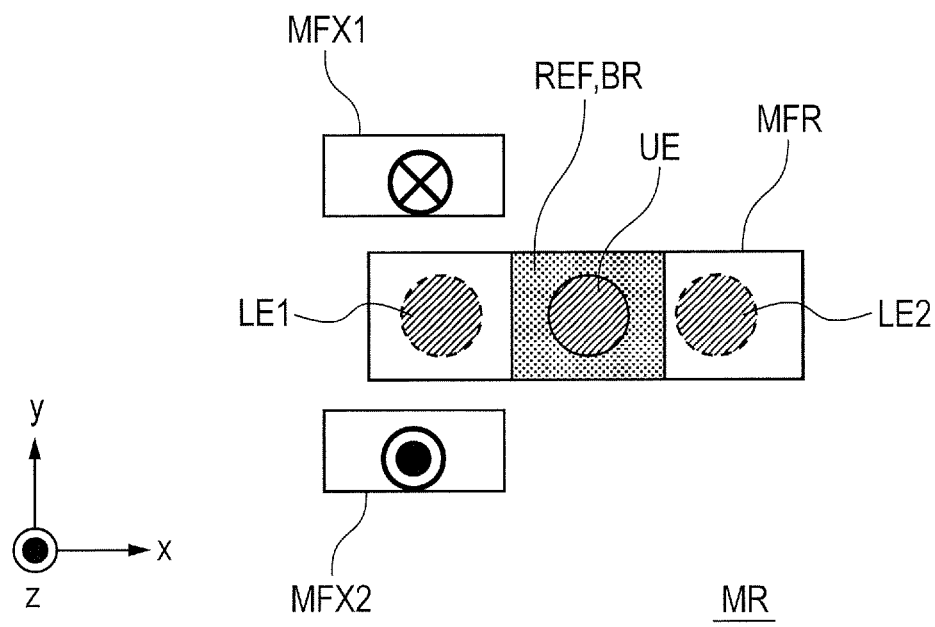
FIG. 27 is a plan diagram of a magnetoresistive effect element according to a modification 11.

FIG. 27 is a plan diagram of a magnetoresistive effect element MR according to a modification 11 and corresponds to FIG. 14 of the modification 1. The magnetoresistive effect element MR according to the present modification is similar in configuration to the magnetoresistive effect element MR according to the modification 1 except for the following points.

In the present modification, when no current flows in a magnetization free layer MFR, the entire region of the magnetization free layer MFR has magnetization in a +z-axis direction or a −z-axis direction. That is, the magnetization free layer MFR does not have a magnetic wall introduced by an external magnetic field. Also, a magnetization fixed layer MFX1 and a magnetization fixed layer MFX2 are provided on the side of one end in the longitudinal direction of the magnetization free layer MFR as viewed from the z-axis direction. Further, the magnetization fixed layer MFX1 and the magnetization fixed layer MFX2 are opposed to each other via the magnetization free layer MFR in the lateral direction of the magnetization free layer MFR as viewed from the z-axis direction.

Figure 28:
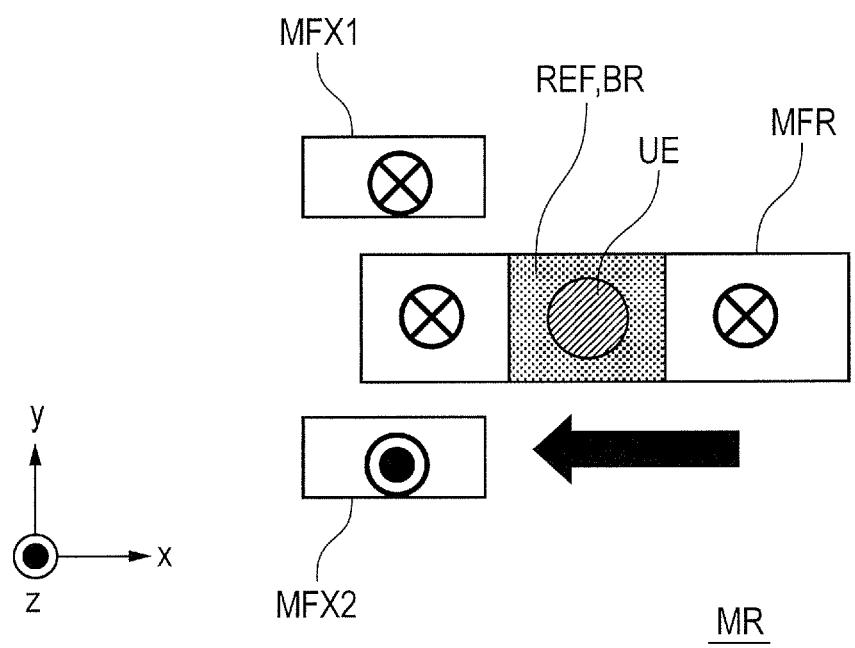
FIG. 28 is a diagram for describing an operation of the magnetoresistive effect element.
Figure 29:
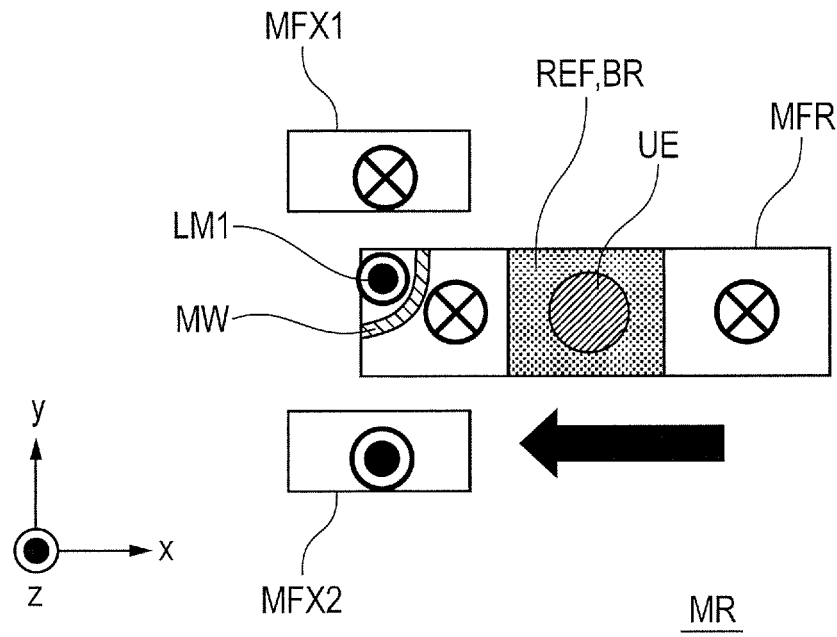
FIG. 29 is a diagram for describing an operation of the magnetoresistive effect element.
Figure 30:
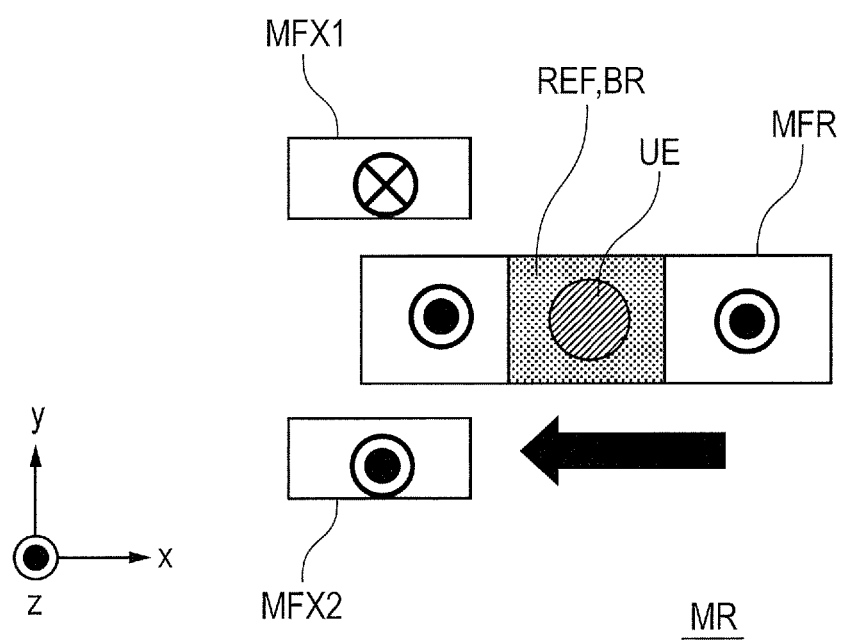
FIG. 30 is a diagram for describing an operation of the magnetoresistive effect element.

A method of writing 0 or 1 and its advantageous effects in the present modification will be described. FIGS. 28 through 30 are diagrams for describing the operations of the magnetoresistive effect element MR and correspond to FIG. 27.

First, as shown in FIG. 28, a current is made to flow in the magnetization free layer MFR. In the example illustrated in the present figure, when no current flows in the magnetization free layer MFR, the magnetization free layer MFR has magnetization in the −z-axis direction. In the example illustrated in the present figure, the current flows in a −x-axis direction.

When the current flows in the magnetization free layer MFR, the coercive force of the magnetization free layer MFR is reduced by a principle similar to the modification 1. Therefore, as shown in FIG. 29, the direction of magnetization of the magnetization free layer MFR is revered in the +z-axis direction by a leakage magnetic field LM1 of the magnetization fixed layer MFX1 in the vicinity of the magnetization fixed layer MFX1 according to the principle similar to the modification 1. As a result, a magnetic wall MW occurs in a boundary between a region in which the magnetization is reversed, and its peripheral region.

The magnetic wall MW is moved in the opposite direction to the direction of the current. Therefore, the magnetic wall MW is moved in a +z-axis direction. As a result, as shown in FIG. 30, the entire magnetization of the magnetization free layer MFR changes from the −z-axis direction to the +z-axis direction.

Incidentally, the current may be made to flow in the magnetization free layer MFR in the −x-axis direction even where the magnetization of the magnetization free layer MFR is revered from the +z-axis direction to the −z-axis direction. In this case, a magnetic wall occurs in the vicinity of the magnetization fixed layer MFX2 as with the above case by a leakage magnetic field LM2 (not shown in FIGS. 28 through 30) of the magnetization fixed layer MFX2. Driving the magnetic wall by the current enables the magnetization of the magnetization free layer MFR to be reversed from the +z-axis direction to the −z-axis direction.

Even in the present modification, the magnetoresistive effect element MR uses the leakage magnetic field LM1 and the leakage magnetic field LM2 as with the modification 1. The current for driving each of the magnetic walls generated by such leakage magnetic fields becomes smaller than the current for driving the magnetic wall introduced by the external magnetic field. Therefore, even in the present modification 11, power consumption of the magnetoresistive effect element MR can be reduced.

(Modification 12)

Figure 31:
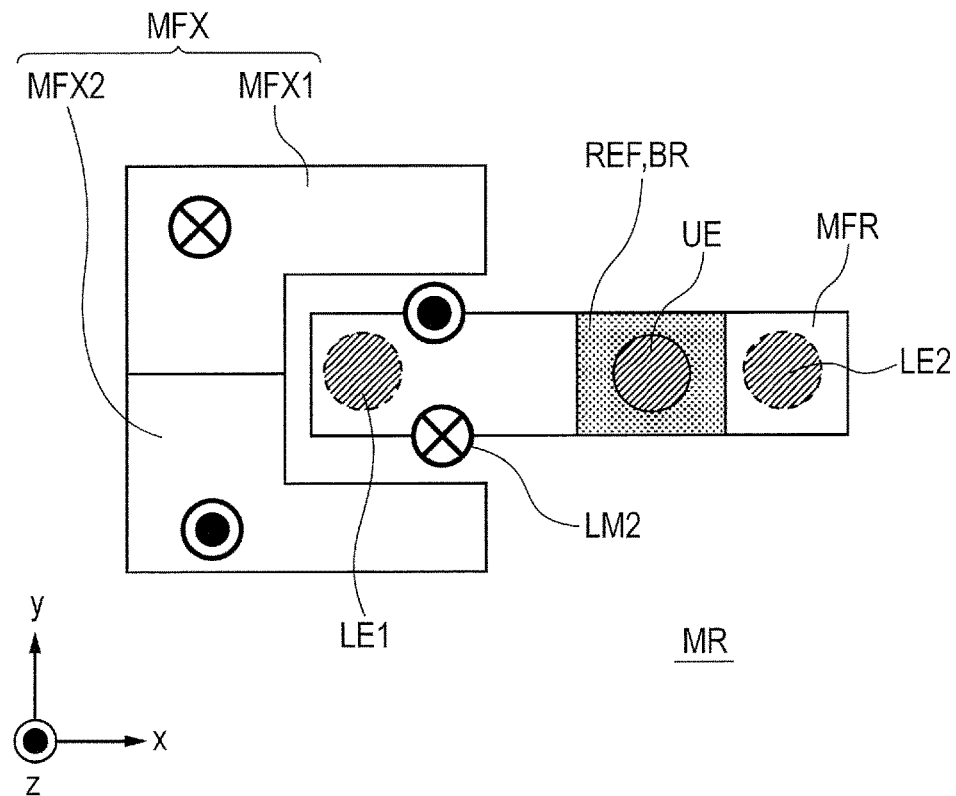
FIG. 31 is a plan diagram of a magnetoresistive effect element according to a modification 12.
Figure 32:
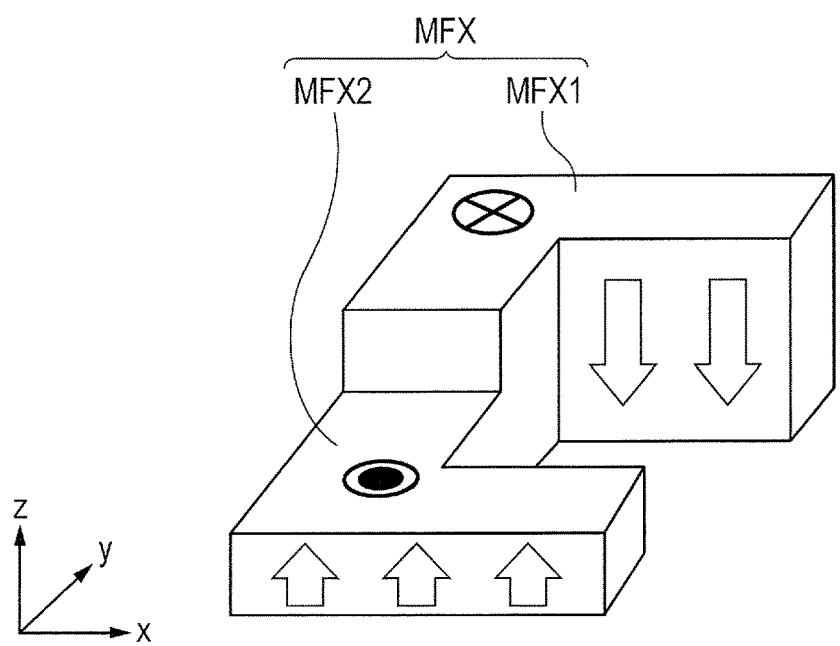
FIG. 32 is an enlarged perspective diagram of a magnetization fixed layer of FIG. 31.

FIG. 31 is a plan diagram of a magnetoresistive effect element MR according to a modification 12 and corresponds to FIG. 27 of the modification 11. FIG. 32 is an enlarged perspective diagram of a magnetization fixed layer MFX of FIG. 31. The magnetoresistive effect element MR according to the present modification is similar in configuration to the magnetoresistive effect element MR according to the modification 11 except for the following points.

In the present modification, a magnetization fixed layer MFX1 and a magnetization fixed layer MFX2 are integrated to configure the magnetization fixed layer MFX. That is, the magnetization fixed layer MFX1 and the magnetization fixed layer MFX2 are formed of the same material. In the example illustrated in the present figure, part of the magnetization fixed layer MFX is etched. Further, the etched part of the magnetization fixed layer MFX serves as the magnetization fixed layer MFX2, and the non-etched part of the magnetization fixed layer MFX serves as the magnetization fixed layer MFX1. The magnetization fixed layer MFX surrounds one end of a magnetization free layer MFR as seen from a z-axis direction. Even in this case, a leakage magnetic field LM1 and a leakage magnetic field LM2 are capable of acting on the magnetization free layer MFR as with the modification 11.

Even in the present modification, the magnetoresistive effect element MR is capable of operating as with the modification 11 using the leakage magnetic field LM1 and the leakage magnetic field LM2 and obtaining a similar effect to the modification 11.

(Modification 13)

FIG. 33 is a cross-sectional diagram of a magnetoresistive effect element MR according to a modification 13 and corresponds to FIG. 2 of the embodiment. The magnetoresistive effect element MR according to the present modification is similar in configuration to the magnetoresistive effect element MR according to the embodiment except for the following points.

In the present modification, a layer BL is provided on the side opposite to a reference layer REF, of a magnetization free layer MFR. The layer BL extends from a region RG2 of the magnetization free layer MFR to a region RG3 thereof. Further, a non-magnetic layer NM1 and a non-magnetic NM2 are opposed to the magnetization free layer MFR via the layer BL interposed therebetween.

The layer BL is a layer that holds the verticality of magnetization of the magnetization free layer MFR. The layer BL contains, for example, Ta or Pt. Further, the layer BL may be a laminated film of Ta and Pt. The layer BL and the magnetization free layer MFR can be formed as, for example, Ta/Pr/Co/Ni (Ta/Pt is equivalent to the layer BL).

Even in the present modification, the magnetoresistive effect element MR is capable of operating as with the embodiment using leakage magnetic fields LM1 and LM2 and obtaining a similar effect to the embodiment. Further, in the present modification, the verticality of magnetization of the magnetization free layer MFR is suitably held by the presence of the layer BL.

Although the invention made above by the present inventors has been described specifically on the basis of the preferred embodiments, the present invention is not limited to the embodiments referred to above. It is needless to say that various changes can be made thereto within the scope not departing from the gist thereof.

What is claimed is:

1. A semiconductor device comprising:
a magnetization free layer;
a reference layer electrically coupled to a first surface of the magnetization free layer;
a first magnetization fixed layer provided in the vicinity of the magnetization free layer;
a first wiring electrically and physically coupled directly to the magnetization free layer at a first location the magnetization free layer; and
a second wiring electrically and physically coupled directly to the magnetization free layer at a second location the magnetization free layer,
wherein the first magnetization fixed layer is not electrically coupled to the magnetization free layer, and
wherein the first wiring and the second wiring are distinct from each other.

2. The semiconductor device according to claim 1, further including a second magnetization fixed layer provided in the vicinity of the magnetization free layer,
wherein the second magnetization fixed layer is not electrically coupled to the magnetization free layer, and
wherein the second magnetization fixed layer is positioned on the side opposite to the side of the first magnetization fixed layer via the reference layer as viewed from the side of the first surface.

3. The semiconductor device according to claim 2,
wherein a plurality of the magnetization free layers are arranged in a first direction as viewed from the side of the first surface,
wherein each of the magnetization free layers has a longitudinal direction in the first direction as viewed from the side of the first surface,
wherein in the magnetization free layers adjacent to each other in the first direction, the second magnetization fixed layer for one of the magnetization free layers and the first magnetization fixed layer for the other thereof are the same magnetization fixed layer, and
wherein the magnetization fixed layer extends from one of the magnetization free layers to the other thereof as viewed from the side of the first surface.

4. A semiconductor device comprising:
a magnetization free layer;
a reference layer electrically coupled to a first surface of the magnetization free layer;
a first magnetization fixed layer provided in the vicinity of the magnetization free layer;
a wiring electrically coupled to the magnetization free layer;
a second magnetization fixed layer provided in the vicinity of the magnetization free layer,
wherein the first magnetization fixed layer is not electrically coupled to the magnetization free layer,
wherein the second magnetization fixed layer is not electrically coupled to the magnetization free layer,
wherein the second magnetization fixed layer is positioned on the side opposite to the side of the first magnetization fixed layer via the reference layer as viewed from the side of the first surface,
wherein a plurality of the magnetization free layers are arranged in a first direction as viewed from the side of the first surface;
wherein each of the magnetization free layers has a longitudinal direction in a second direction intersecting with the first direction as viewed from the side of the first surface;
wherein the magnetization free layer and the first magnetization fixed layer are alternately provided in the first direction, and
wherein the magnetization free layer and the second magnetization fixed layer are alternately provided in the first direction.

5. The semiconductor device according to claim 4, wherein the wiring is in contact with the magnetization free layer.

6. A semiconductor device comprising:
a magnetization free layer;

a reference layer electrically coupled to a first surface of the magnetization free layer;

a first magnetization fixed layer provided in the vicinity of the magnetization free layer;

a wiring electrically coupled to the magnetization free layer; and a second magnetization fixed layer provided in the vicinity of the magnetization free layer, wherein the first magnetization fixed layer is not electrically coupled to the magnetization free layer, wherein the second magnetization fixed layer is not electrically coupled to the magnetization free layer, wherein the first magnetization fixed layer and the second magnetization fixed layer are provided on the side of one end in a longitudinal direction of the magnetization free layer as viewed from the side of the first surface, and wherein the first magnetization fixed layer and the second magnetization fixed layer are opposed to each other via the magnetization free layer in a lateral direction of the magnetization free layer as viewed from the side of the first surface.

7. The semiconductor device according to claim 6, wherein the wiring is electrically coupled directly to the magnetization free layer.

* * * * *